United States Patent
Mansky et al.

(10) Patent No.: US 9,490,048 B2
(45) Date of Patent: Nov. 8, 2016

(54) ELECTRICAL CONTACTS IN LAYERED STRUCTURES

(71) Applicant: CHAMP GREAT INT'L CORPORATION, Eden Island (SC)

(72) Inventors: Paul Mansky, San Francisco, CA (US); Kalpesh Biyani, Fremont, CA (US)

(73) Assignee: CAM Holding Corporation, Tortola (VG)

( * ) Notice: Subject to any disclaimer, the term of this patent is extended or adjusted under 35 U.S.C. 154(b) by 278 days.

(21) Appl. No.: 13/839,689

(22) Filed: Mar. 15, 2013

(65) Prior Publication Data

US 2013/0273315 A1 Oct. 17, 2013

Related U.S. Application Data

(60) Provisional application No. 61/617,581, filed on Mar. 29, 2012.

(51) Int. Cl.
*B32B 3/24* (2006.01)
*H01B 7/00* (2006.01)
*H01B 1/22* (2006.01)
*B82Y 30/00* (2011.01)

(52) U.S. Cl.
CPC *H01B 7/00* (2013.01); *H01B 1/22* (2013.01); *B82Y 30/00* (2013.01); *G06F 2203/04103* (2013.01); *Y10T 428/24331* (2015.01); *Y10T 428/24339* (2015.01)

(58) Field of Classification Search
CPC .. H01B 7/00; H01B 1/22; Y10T 428/24331; Y10T 428/24339
USPC .................................................. 428/138, 139
See application file for complete search history.

(56) References Cited

U.S. PATENT DOCUMENTS

| | | | |
|---|---|---|---|
| 8,049,333 | B2 | 11/2011 | Alden et al. |
| 8,454,721 | B2 | 6/2013 | Allemand |
| 2005/0184641 | A1 | 8/2005 | Armitage et al. |
| 2005/0196707 | A1 | 9/2005 | Cok |
| 2008/0157080 | A1 | 7/2008 | Gruner et al. |
| 2008/0259262 | A1 | 10/2008 | Jones et al. |
| 2009/0085072 | A1 | 4/2009 | Lee et al. |
| 2009/0262175 | A1 | 10/2009 | Kim et al. |
| 2009/0309843 | A1* | 12/2009 | Kim et al. ............ 345/173 |
| 2010/0197068 | A1 | 8/2010 | Poon et al. |
| 2012/0024572 | A1 | 2/2012 | Naoi et al. |

FOREIGN PATENT DOCUMENTS

WO 2012/040637 A2 3/2012

OTHER PUBLICATIONS

Sun et al., "Crystalline Silver Nanowires by Soft Solution Processing," Nano Letters 2(2): 165-168, 2002.

* cited by examiner

Primary Examiner — William P Watkins, III
(74) Attorney, Agent, or Firm — Cooper Legal Group, LLC

(57) ABSTRACT

Various embodiments of the present disclosure are directed to structures comprising a nanostructure layer that includes a plurality of transparent conductors and coating layer formed on a surface thereof. In some embodiments, the coating layer includes one or more conductive plugs having outer and inner surfaces. The inner surface the plug is placed in electrical communication with the nanostructure layer and the outer surface forms conductive surface contacts proximate an outer surface of the coating layer. In some embodiments, the structure includes a polarizer and is used as a shielding layer in flat panel electrochromic displays, such as liquid crystal displays, touch panels, and the like.

19 Claims, 9 Drawing Sheets

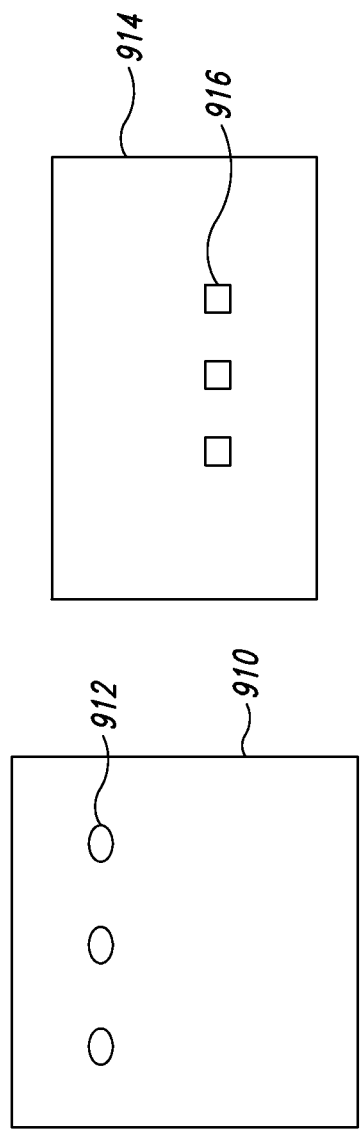
FIG. 11A
FIG. 11B
FIG. 11C
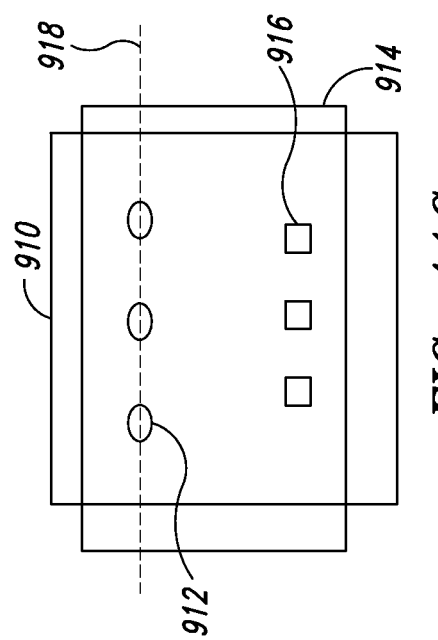
FIG. 11D

ELECTRICAL CONTACTS IN LAYERED STRUCTURES

BACKGROUND

Conductive nanostructures have been used to form thin conductive films, referred to as a nanostructure layer. In the nanostructure layer, one or more electrically conductive paths are established through continuous physical contacts among the conductive nanostructures. Generally described, the nanostructure layer may be formed by depositing a liquid dispersion (or coating composition) comprising a liquid carrier and a plurality of the conductive nanostructures. Upon the liquid dispersion drying, a nanostructure layer of networking nanostructures is formed. The nanostructure layers are suitably transparent for a variety of uses in flat panel electrochromic displays, with one such use being as a transparent electrode.

BRIEF SUMMARY

In accordance with aspects of the present disclosure, an embodiment of a structure is provided. The structure includes an electrically conductive nanostructure layer having opposite first and second surfaces and the nanostructure layer includes a plurality of nanostructures. The structure further includes a coating layer having opposite inner and outer surfaces. The inner surface of the coating layer overlies the second surface of the nanostructure layer. The coating layer has a conductive plug that extends from the inner surface of the coating layer to the outer surface of the coating layer. The conductive plug is configured to be placed in electrical communication with the nanostructure layer. In one embodiment, the coating layer of the nanostructure or nanowire layer includes a reflowable polymer that may include poly(methyl methacrylate) (PMMA), a dissolved powder coating resin, a copolymer of methyl methacrylate, a hydroxyl functional monomer, a carboxylate functional monomer, an amine monomer and/or an epoxy monomer. The coating layer may also include a UV curable resin, a blocked isocyanate and/or a melamine based cross-linker and/or other adhesion promoters to enhance adhesion of the coating layer to the nanowire layer.

In accordance with aspects of the present disclosure, an embodiment of a display is provided. The display includes a nanostructure layer having opposite first and second surface and the nanostructure layer includes a plurality of nanostructures. The display further includes a coating layer having opposite inner and outer surfaces. The inner surface of the coating layer overlies the second surface of the nanostructure layer. The coating layer has a conductive plug therein. The conductive plug has a first end configured to be placed in electrical communication with the nanostructure layer and a second end exposed from the coating layer. The nanostructure layer further includes a substrate proximate the first surface of the nanostructure layer. In one embodiment, the coating layer includes a reflowable polymer and may also include a UV curable resin, a blocked isocyanate and/or a melamine based cross-linker and/or other adhesion promoters to enhance adhesion of the coating layer to the nanostructure layer.

In accordance with aspects of the present disclosure, another embodiment of a structure is provided. The structure includes a nanostructure layer having opposite first and second surfaces. The nanostructure layer includes a plurality of nanostructures. The structure further includes a coating layer having opposite inner and outer surfaces. The inner surface of the coating layer overlies the second surface of the nanostructure layer. The structure further includes a conductive contact proximate to the side surface of the coating layer. The conductive contact has a surface that is in electrical communication with the nanostructure layer.

In accordance with aspects of the present disclosure, a method of forming a structure that includes a nanostructure layer having a surface and the nanostructure layer includes a plurality of nanostructures. The method includes forming coating layer having opposite first and second surfaces onto the surface of the nanostructure layer and forming a void in the coating layer. The void extends from the first surface to the second surface. The method further includes at least partially filling the void with a conductive material.

In accordance with aspects of the present disclosure, another method of forming a layered structure is provided. The layered structure includes a nanostructure layer having a surface and the nanostructure layer includes a plurality of nanostructures. The method includes forming a coating layer having opposite first and second surfaces onto the surface of the nanostructure layer and depositing a conductive plug into the coating layer. The conductive plug has a first portion configured to be placed in electrical communication with the nanostructure layer and a second portion exposed from the coating layer. The method further includes hardening the coating layer. In one embodiment, the coating layer includes a reflowable polymer, as defined herein. More specifically, the reflowable polymer may include PMMA, a dissolved powder coating resin, a copolymer of methyl methacrylate, a hydroxyl functional monomer, a carboxylate functional monomer, an amine monomer and/or an epoxy monomer. The coating layer may also include a UV curable resin, a blocked isocyanate, a melamine based cross-linker and/or other adhesion promoter. In one embodiment, the layered structure may be stored for up to 27 weeks after forming the coating layer and before depositing the conductive plugs into the coating layer.

BRIEF DESCRIPTION OF THE SEVERAL VIEWS OF THE DRAWINGS

In the drawings, identical reference numbers identify similar elements. The sizes and relative positions of elements in the drawings are not necessarily drawn to scale. For example, the shapes of various elements and angles are not drawn to scale, and some of these elements are arbitrarily enlarged and positioned to improve drawing legibility. Further, the particular shapes of the elements as drawn are not intended to convey any information regarding the actual shape of the particular elements, and they have been solely selected for ease of recognition in the drawings.

FIGS. 11A-11D illustrate an example used to form a structure in accordance with aspects of the present disclosure.

DETAILED DESCRIPTION

As indicated above, the nanostructure layers described herein are suitably transparent and electrically conductive for a variety of uses in flat panel electrochromic displays. Typically, such displays include a conductive shielding layer to protect against electromagnetic interference (EMI) and electrostatic discharge (ESD). In various embodiments, the nanostructure layers described herein provide a conductive and transparent shielding layer, which may, in one embodiment, be used for providing EMI and ESD shielding for/between the touch sensor, display, or their combination. In other embodiments, the nanostructure layers described herein may also comprise a driving or sensing layer for a capacitive touch sensor; an electrode for charge injection into or withdrawal from an OLED lighting device or photovoltaic cell; an electrode for driving a display device such as a liquid crystal, OLED, or electronic paper display; and the like.

Various embodiments of the present disclosure are directed to layered structures that include a nanostructure layer with coating layer formed on a surface thereof. The coating layer may be applied to the nanostructure layer as a liquid coating solution and dried or hardened to form a solid coating layer; the coating layer may also consist of a pre-formed solid film which is laminated or otherwise adhered to the nanostructure layer. The nanostructure layer is configured to be placed in electrical communication with another component, such as ground or an electrical circuit. In various embodiments, the coating layer includes one or more conductive contacts that are configured to electrically couple the nanostructure layer to the outer surface of the coating layer. In some embodiments, the structure further includes a substrate and is used as a shielding layer in flat panel electrochromic displays, such as liquid crystal displays (LCD), touch panels, and the like. The coating layer may be configured to provide mechanical and/or chemical protection to one or both of the substrate and the nanostructure layer. The coating layer may also be used to for enhanced appearance, such as to reduce glare, reflection, or any other purpose. In that regard, the coating layer may have an anti-glare film or anti-reflecting film formed on a surface thereof or formed in a surface thereof.

Figure 1:
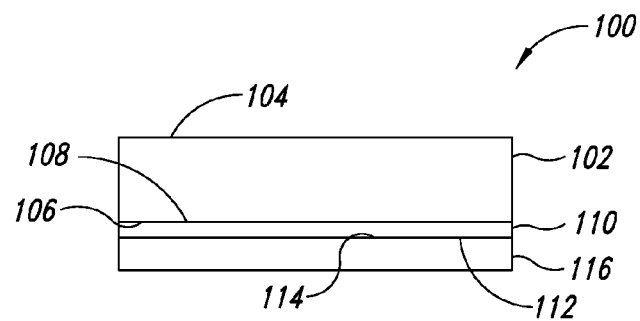
FIG. 1 is a cross-section view of a portion of one embodiment of a layered structure in accordance with aspects of the present disclosure.

FIG. 1 shows a layered structure 100 in accordance with one embodiment of the present disclosure. The structure 100 may be at transparent or have portions that are transparent.

The structure 100 comprises coating layer 102 having opposite outer and inner surfaces 104, 106. The inner surface 106 of the coating layer 102 is on a first surface 108 of a nanostructure layer 110. A second surface 112 of the nanostructure layer 110 is on a first surface 114 of a substrate 116. In one embodiment, the coating layer 102 is formed on the first surface 108 of the nanostructure layer 110 thereby adhering the coating layer to the nanostructure layer 110. In another embodiment, a portion of the nanostructure layer 110 is formed on the first surface 114 of the substrate 116, thereby adhering the nanostructure layer 110 to the substrate 116. In yet another embodiment, the nanostructure layer 110 is formed on the inner surface 106 of the coating layer 102 and the substrate 116 is adhered to the nanostructure layer 110.

In various embodiments, the layered structures described herein provide one or more surface contacts proximate the outer surface of the coating layer 102 at predetermined locations or randomly distributed. The surface contacts may be provided over a particular area or over the entire area of the coating layer. The stacks can be customized by the end user into any configuration (size, shape, and the like) while maintaining sufficient surface contacts. Certain embodiments provide contact through a thick coating layer or barrier layer (e.g. thicker than 0.2 µm, thicker than 1 µm or even thicker than 3 µm).

In some embodiments, the structure 100 is formed from a larger sheet comprising the protective coating layer, the nanostructure layer, and the substrate and then subsequently cut into individual structures of a particular size and shape to form the structure 100.

Figure 2A:
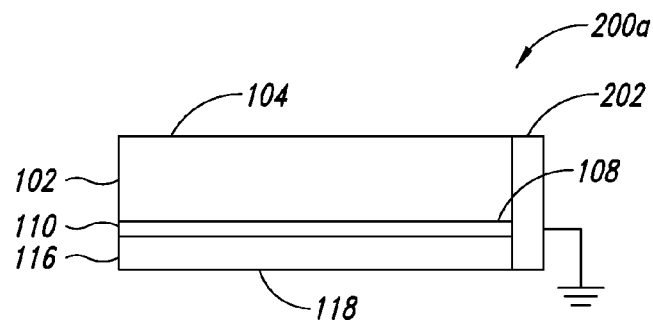
FIGS. 2A-2C are cross-section views of a portion of structures in accordance with aspects of the present disclosure.
Figure 2B:
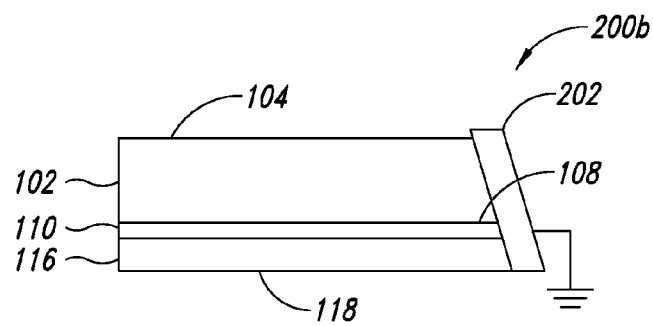
Figure 2C:
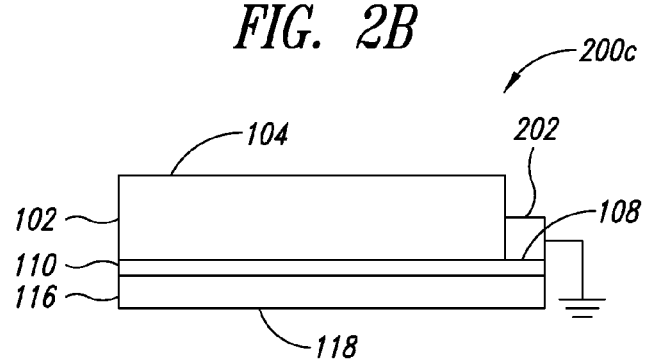

FIGS. 2A-2C illustrate other structures 200A-200C in accordance with aspects of the present invention. The structures 200A-200C are similar in structure to the structure 100 in FIG. 1, except that the structures 200A-200C include one or more conductive contacts 202 along a side surface of at least a portion thereof. In the embodiments shown in FIGS. 2A-2C, a conductive contact 202 is in electrical communication with the nanostructure layer 110 via a side surface of the nanostructure layer 110. In particular, the conductive contact 202 may be in electrical contact with one or more conductive nanostructures formed in the conductive layer 110.

As shown in FIG. 2A, the conductive contact 202 may be located perpendicular with the side surface of the structure 200A and extend from the outer surface 104 of the coating layer 102 to a second surface 118 of the substrate 116. As shown in FIG. 2B, the conductive contact 202 may be at an angle relative to the structure 200B and in some cases, extend beyond the outer surface 104 of the coating layer 102. As shown in FIG. 2C, the conductive contact 202 may be located on the first surface 108 of the nanostructure layer 110 extending along a side surface of the coating layer 102 and remain below the outer surface 104 of the coating layer 102. Although the conductive contact shown in FIG. 2A is flush with the outer surface 104 of the coating layer, the conductive contact in FIG. 2B extends beyond the outer surface 104 of the coating layer 102, and the conductive contact 202 in FIG. 2C is below the outer surface of the coating layer, it is to be appreciated that each embodiment may extend above, be flush with, or remain below the outer surface 104 of the coating layer 102. It is to be appreciated that the side surface of the structures may include imperfections due to the cutting process that may advantageously expose nanostructures, thereby encouraging electrical contact between the nanostructure layer 110 and the conductive contact 202.

In one embodiment, the conductive contact 202 comprises liquid conductive paste, paint, or conductive epoxy, such as those comprising silver, copper, nickel, aluminum, graphite, carbon, and the like, and any combination thereof. In another embodiment the conductive contact 202 comprises a conducting tape, such as copper or aluminum tape. In another embodiment, the conductive contact 202 comprises a conducting layer deposited by a vapor deposition or an electrochemical deposition process, such as evaporation, sputtering, chemical vapor deposition, electroplating, or electroless plating.

Figure 3A:
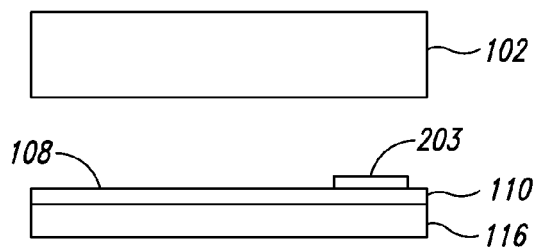
FIGS. 3A-3D illustrate an embodiment for forming a conductive contact using a buried contact in accordance with aspects of the present disclosure.
Figure 3B:
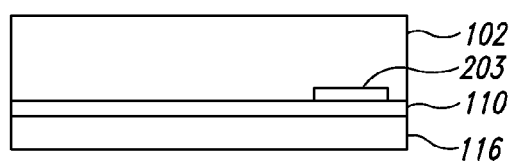
Figure 3C:
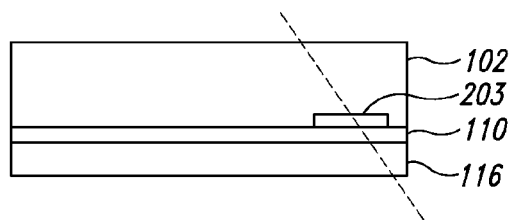
Figure 3D:
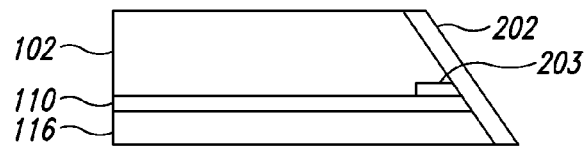

In another embodiment, at least one buried contact may be formed in the structure, such as on the first surface 108 of the nanostructure layer 110, before the coating layer 102 is formed thereon. FIGS. 3A-3D illustrate one embodiment for forming a conductive contact using a buried contact. As shown in FIG. 3A, a buried contact 203, such as conductive ink or conductive film, may be formed on the first surface 108 of the nanostructure layer 110. In one embodiment, the buried contact 203 is located proximate the perimeter of each individual structure on a sheet. In particular, the buried contact may be placed along a cutting line (the dotted line shown in FIG. 3C), such that when the sheet is cut into the individual structures, the conductive ink or film is exposed at the side or cut surface thereof. As shown in FIG. 3B, the coating layer 102 is formed on or attached to the first surface 108 of the nanostructure layer 110 and the buried contact 203. As shown in FIG. 3C, the structure is cut thereby exposing a portion of the buried contact 203. As shown in FIG. 3D, a conductive contact 202 is formed on the side surface of the structure.

In some embodiments, the buried contacts 203 or conductive contacts 202 are placed at one or more particular locations at the perimeter of the individual structures. In such embodiments, the center portion of the structures may remain transparent, while the buried contacts may reduce the transparency at the perimeters. In some embodiments, the buried contacts are between approximately 1 μm and approximately 5 μm thick.

As shown in the illustrated embodiment, the side surface of the nanostructure layer 110 may be further coupled to another electrical circuit or ground, thereby configuring the structure 100 to protect a display or touch panel incorporating the structure 100 therein from electrical side effects, such as ESD and EMI, or to provide functionality such as capacitive touch sensing.

Figure 4:
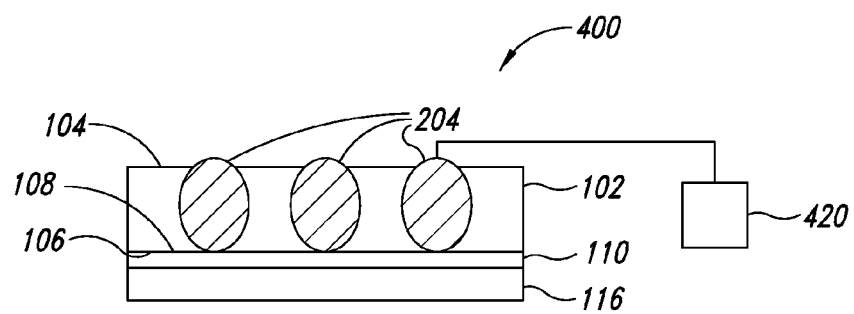
FIG. 4 is a cross-section view of a portion of another embodiment of a structure in accordance with aspects of the present disclosure.

FIG. 4, there is shown a structure 400 in accordance with another embodiment of the present disclosure. The structure 400 is similar to the structure 100 in FIG. 1, except that the structure 400 may include one or more conductive plugs 204 within the coating layer 102. The plugs 204 comprise a conductive material and are configured to span from the outer surface 104 of the coating layer 102 to the inner surface 106 of the coating layer 102, thereby forming an electrical path through the coating layer 102.

An inner surface of the conductive plugs 204 is proximate the inner surface 106 of the coating layer 102 and is in electrical contact with the first surface 108 of the nanostructure layer 110 or with a conductive material there between, such as bonding material. In that regard, the inner surface of the conductive plugs 204 is in electrical communication with the conductive nanostructures in the nanostructure layer 110. An outer surface of the conductive plugs 204 is exposed at the outer surface 104 of the coating layer 102. In the illustrated embodiment, the outer surface of the conductive plugs 204 extends above the outer surface 104 of the coating layer 102. In that regard, the conductive plugs 204 may have at least one dimension, such as a length or a diameter, which is greater than the thickness of the coating layer 102. It is to be appreciated, however, that the conductive plugs 204 may be equal to or less than the thickness of the coating layer 102 so long as a portion of the conductive plugs 204 is exposed from the coating layer 102 (i.e. not covered by the coating layer). The plugs 204 may comprise a single conductive particle or a plurality of conducting particles, and may also comprise a combination of conducting and non-conducting materials, so long as a conducting path is established through the plug.

The exposed portion of the outer surface of the conductive plugs 204 provides conductive surface contacts. In that regard, a portion of the outer surface 104 of the coating layer 102 may be placed in electrical communication with the nanostructure layer 110. As is shown in the illustrated embodiment, the exposed portion that provides conductive surface contacts may be coupled to ground or to an electrical circuit 420. It is to be appreciated that when the outer surface of the conductive plugs 204 is in electrical communication with ground, the structure) 400 may provide a useful function, such as EMI or ESD shielding for the display or touch panel.

Conductive Nanostructures

Generally described, the conductive nanostructures (or nanowires) referred to above are nano-sized conductive structures that are used to form thin conductive films. In the thin conductive films, one or more electrically conductive paths are established through continuous physical contacts among the nanostructures. A conductive network of nanostructures is formed when sufficient nanostructures are present to reach an electrical percolation threshold. The electrical percolation threshold is therefore an important value above which long range connectivity can be achieved. In general, the conductive nanostructure have at least one dimension of which is less than 500 nm, more preferably, less than 250 nm, 100 nm, 50 nm or 25 nm.

The nanostructures can be of any shape or geometry. In certain embodiments, the nanostructures are isotropically shaped (i.e., aspect ratio=1). Typical isotropic nanostructures are nanoparticles, which may be the same or different from the nanoparticles that form plugs. In preferred embodiments, the nanostructures are anisotropically shaped (i.e., aspect ratio≠1). As used herein, "aspect ratio" refers to the ratio between the length and the width (or diameter) of the nanostructure. The anisotropic nanostructure typically has a longitudinal axis along its length. Exemplary anisotropic nanostructures include nanowires and nanotubes, as defined herein.

The nanostructures can be solid or hollow. Solid nanostructures include, for example, nanoplugs and nanowires. "Nanowires" thus refers to solid anisotropic nanostructures. Typically, each nanowire has an aspect ratio (length:diameter) of greater than 10, preferably greater than 50, and more preferably greater than 100. Typically, the nanowires are more than 500 nm, more than 1 μm, or more than 10 μm long.

Hollow nanostructures include, for example, nanotubes. Typically, the nanotube has an aspect ratio (length:diameter) of greater than 10, preferably greater than 50, and more preferably greater than 100. Typically, the nanotubes are more than 500 nm, more than 1 μm, or more than 10 μm in length.

The nanostructures can be formed of any electrically conductive material. Most typically, the conductive material is metallic. The metallic material can be an elemental metal (e.g., transition metals) or a metal compound (e.g., metal oxide). The metallic material can also be a bimetallic material or a metal alloy, which comprises two or more types of metal. Suitable metals include, but are not limited to, silver, gold, copper, nickel, gold-plated silver, platinum and palladium. The conductive material can also be non-metallic, such as carbon or graphite (an allotrope of carbon).

Nanostructure Layer

As indicated above, a nanostructure layer has been used as a transparent electrode in displays. As described herein, however, nanostructure layers can also be used as a shielding layer to protect against electrical EMI and ESD. The nanostructure layer (also referred to as a transparent conductor layer) is formed by depositing a liquid dispersion (or coating composition) comprising a liquid carrier and a plurality of conductive nanostructures, and allowing the liquid carrier to dry.

The nanostructure layer comprises nanostructures, such as those described above, that are randomly distributed and interconnect with one another. As the number of the nanostructures reaches the percolation threshold, the thin film is electrically conductive. Other non-volatile components of the ink composition, including, for example, one or more binders, surfactants and viscosity modifiers, may form part of the conductive film. Thus, unless specified otherwise, as used herein, "conductive film" and "nanostructure layer" and "nanowire layer" refer to, interchangeably, a nanostructure layer formed of networking and percolative nanostructures combined with any of the non-volatile components of the ink composition, and may include, for example, one or more of the following: viscosity modifier or a binder, surfactant and corrosion inhibitor.

The liquid carrier for the dispersion may be water, an alcohol, a ketone or a combination thereof. Exemplary alcohols may include isopropanol (IPA), ethanol, diacetone alcohol (DAA) or a combination of IPA and DAA. Exemplary ketones may include methyl ethyl ketone (MEK) and methyl propyl ketone (MPK).

The surfactants serve to reduce aggregation of the nanostructures and/or the light-scattering material. Representative examples of suitable surfactants include fluorosurfactants such as ZONYL® surfactants, including ZONYL® FSN, ZONYL® FSO, ZONYL® FSA, ZONYL® FSH (DuPont Chemicals, Wilmington, Del.), and NOVEC™ (3M, St. Paul, Minn.). Other exemplary surfactants include non-ionic surfactants based on alkylphenol ethoxylates. Preferred surfactants include, for example, octylphenol ethoxylates such as TRITON™ (×100, ×114, ×45), and nonylphenol ethoxylates such as TERGITOL™ (Dow Chemical Company, Midland Mich.). Further exemplary non-ionic surfactants include acetylenic-based surfactants such as DYNOL® (604, 607) (Air Products and Chemicals, Inc., Allentown, Pa.) and n-dodecyl β-D-maltoside.

The viscosity modifier serves as a binder that immobilizes the nanostructures on a substrate. Examples of suitable viscosity modifiers include hydroxypropyl methylcellulose (HPMC), methyl cellulose, xanthan gum, polyvinyl alcohol, carboxy methyl cellulose, and hydroxy ethyl cellulose.

In particular embodiments, the weight ratio of the surfactant to the viscosity modifier in the coating solution is preferably in the range of about 80:1 to about 0.01:1; the weight ratio of the viscosity modifier to the conductive nanostructures is preferably in the range of about 5:1 to about 0.000625:1; and the weight ratio of the conductive nanostructures to the surfactant is preferably in the range of about 560:1 to about 5:1. The ratios of components of the coating solution may be modified depending on the substrate and the method of application used. A preferred viscosity range for the coating solution is between about 1 and 100 cP.

In one embodiment, the coating solution may initially contain a binder (e.g., HPMC) to facilitate film forming. In some embodiments, the binder is removed thereafter such that the nanostructures form a discontinuous layer and do not interfere with the optical interaction between the anti-reflective layer and the organic stack.

The electrical conductivity of the conductive film is often measured by "sheet resistance," which is represented by Ohms/square (or "ohms/sq"). The sheet resistance is a function of at least the surface loading density, the size/shapes of the nanostructures, and the intrinsic electrical property of the nanostructure constituents. As used herein, a thin film is considered conductive if it has a sheet resistance of no higher than $10^8$ ohms/sq. Preferably, the sheet resistance is no higher than $10^4$ ohms/sq, 3,000 ohms/sq, 1,000 ohms/sq or 350 ohms/sq, or 100 ohms/sq. Typically, the sheet resistance of a conductive network formed by metal nanostructures is in the ranges of from 10 ohms/sq to 1000 ohms/sq, from 100 ohms/sq to 750 ohms/sq, 50 ohms/sq to 300 ohms/sq, from 100 ohms/sq to 500 ohms/sq, or from 100 ohms/sq to 250 ohms/sq, or 10 ohms/sq to 300 ohms/sq, from 10 ohms/sq to 50 ohms/sq, or from 1 ohms/sq to 10 ohms/sq. For the opto-electrical devices described herein, the sheet resistance is typically less than 20 ohms/square, or less than 15 ohms/square, or less than 10 ohms/square.

Optically, the nanostructure-based transparent conductors have high light transmission in the visible region (400 nm-700 nm). Typically, the transparent conductor is considered optically clear when the light transmission is more than 70%, or more typically more than 85% in the visible region. More preferably, the light transmission is more than 90%, more than 93%, or more than 95%. As used herein, unless specified otherwise, a conductive film is optically transparent (e.g., more than 70% in transmission). Thus, transparent conductor, transparent conductive film, layer or coating, conductive film, layer or coating, and transparent electrode are used interchangeably.

In general, the thickness of the nanostructure layer is between 10 nm and 1000 nm and in some embodiments, between 20 nm and 200 nm. In yet some embodiments, the thickness is between 70 nm and 130 nm, and in one embodiment, the thickness of the nanostructure layer is 100 nm.

Coating Layer

In various embodiments, the coating layer comprises an insulative material and may have one or more portions that are substantially transparent, such as between about 440 nm to 700 nm. Non-limiting examples include resins, polymers, and the like. The coating layer may be a UV-cured resin such as an acrylic, urethane acrylate, or epoxy acrylate. Or it may be a thermally cured resin, such as an epoxy or silicone. Or it may be a thermoplastic resin, i.e. a non-crosslinked high molecular weight polymer which is solid under storage and operating conditions, but can be melted by heating or dissolved in a solvent. In some embodiments, conductive material is formed in the coating layer.

The coating layer may be formed from a flowable material, such as an overcoat, and in some embodiments may require one or more curing or baking step to harden the material. The coating layer may be formed on the nanostructure layer such that the coating layer cures or dries on the nanostructure layer. In other embodiments, the coating layer is a pre-existing film that is bonded to the nanostructure layer, e.g. by a lamination process.

In some embodiments, one or more layers of the coating layer functions as an anti-glare and/or anti-reflective coating. Curing as referred to herein may include any curing process that causes the coating layer to form a solid material, such as by cross-linking. Nonlimiting examples include irradiating the coating layer material with visible or ultraviolet (UV) light, electron beams, thermal curing, and the like.

In general, the coating layer may mechanically and/or chemically protect the substrate and/or the nanostructure layer, such as protect the nanostructure layer from environmental factors that can damage the nanostructure layer. In that regard, one or more layers of the coating layer may have a hardness rating that is greater than the hardness rating of the nanostructure layer. In some embodiments, the coating layer may have a pencil hardness rating of between 2H-5 H, with one embodiment being 3H. The coating layer can also act as a chemical barrier, reducing the rate at which liquids, gases, and substances dissolved or suspended therein can come in contact with the nanostructure layer from the environment.

It is to be appreciated that the coating layer may be formed of one or more layers. Each layer may be formed of a different material, have a different thickness, and formed by a different process than the other layers of the coating layer.

Substrate

The substrate may comprise one or more insulative and/or conductive materials and in some embodiments may have one or more portions that are substantially transparent, such as between about 440 nm to 700 nm. The substrate may be rigid, non-limiting examples include glass, polycarbonates, acrylics, and the like. In other embodiments, the substrate may be flexible, non-limiting examples include polymers, polyesters (e.g., polyethylene terephthalate (PET), polyester naphthalate, and polycarbonate), polyolefins (e.g., linear, branched, and cyclic polyolefins), polyvinyls (e.g., polyvinyl chloride, polyvinylidene chloride, polyvinyl acetals, polystyrene, polyacrylates, and the like), cellulose ester bases (e.g., cellulose triacetate, cellulose acetate), polysulphones such as polyethersulphone, polyimides, silicones and other conventional polymeric films. In one embodiment, the substrate is a polarizer. In one embodiment, the substrate may be the same material as the coating layer as described above and may further include contacts extending therethrough as described herein in reference to the coating layer.

Conductive Plugs

As used herein, conductive plug generally refers to one or more electrically conductive features which span the two surfaces of the coating layer. The conductive plugs are formed, at least in part, from one or more materials configured to conduct electricity. In some embodiments the conductive material of the plugs are formed from a material that is metallic. Suitable metals include, but are not limited to, silver, gold, copper, nickel, gold-plated silver, platinum and palladium. The conductive material can also be non-metallic, such as carbon or graphite (an allotrope of carbon).

As will be explained below, the conductive plugs may be in a liquid, semi-liquid, such as paste, or solid form when provided in the coating layer. When in a solid form, the conductive plugs can be of any shape or geometry. In some embodiments, the conductive plugs are formed into a particular geometric shape, non-limiting examples spherical, cylindrical, oblong, and the like. When the conductive plugs are applied in a paste form and used to fill a void in the coating layer as will be explained below, the conductive plugs may partly or fully fill the shape of the void. In one embodiment, the conductive plug does not fill the void but rather extends along the cross-sectional surfaces of coating layer at the perimeter of the void. In one embodiment, the conductive plugs are conventional flexible connectors having conductive contacts at each end as is well known in the art. The flexible connectors may include a first contact that is in electrical communication with the nanostructure layer and a second contact that is exposed proximate the outer surface of the coating layer. Non-limiting examples for the flexible connector include flexible printed circuits, wires, springs, and the like.

As indicated above, the size of the conductive plugs may depend on the thickness of the coating layer to allow a portion of the outer surface of the conductive plugs to be exposed from the coating layer. As indicated above, the outer surface of the plugs may extend beyond the outer surface of the coating layer, be flush with the outer surface of the coating layer, or remain below the outer surface of the coating layer so long as a portion of the outer surface of the plug remains uncovered by the coating layer.

Figure 5:
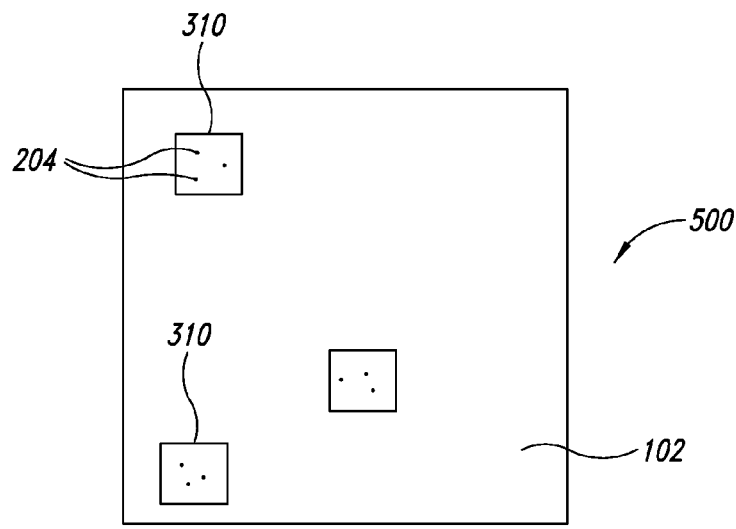
FIG. 5 is a top view of a portion of another embodiment of a structure in accordance with aspects of the present disclosure.

The plugs may be distributed randomly throughout the coating layer or distributed at predetermined locations. In some embodiments, a contact area may be formed in the coating layer to indicate a predetermined location for the plugs. FIG. 5 illustrates structure 500, which is similar to the structure 400 in FIG. 4, except that the structure 500 further includes one or more contact areas 310 formed on the surface of the coating layer 102 indicating a predetermined location for one or more conductive plugs 204. A contact area 310 may be any shape or size and more than one conductive plug 204 may be provided in each contact area 310. The placement of the plugs within each contact area may be regular or irregular, and may also be predetermined or random. In one embodiment, the contact area 310 is 1 $mm^2$ or larger and three or more conductive plugs 204 are added to each contact area 310. In another embodiment, the contact area 310 is a ratio of the size of the conductive plugs 204, such as the contact area 310 may be between 1 to 1,000,000 times larger than the individual conductive plugs 204. For instance, in one embodiment, there is a single plug 204 which is the same size as the contact area 310, and in another embodiment, there are a plurality of plugs which measure 5 μm and are distributed over the contact area, which is 1 $cm^2$.

Forming Conductive Plugs in the Coating Layer

As discussed above, the structure may include one or more conductive plugs formed in the coating layer that are configured to electrically couple the nanostructures in the nanostructure layer to another component, such as to a ground or an electrical circuit. Such coupling may be direct, or via another conducting member which is in contact with the surface of the conductive plug and the circuit or ground to be contacted.

The number of conductive plugs in the coating layer and the distribution therein may vary. In one embodiment, the number of conductive plugs is any amount that still allows suitable light transmission in the visible region (i.e. 400 nm-700 nm) for the structure to be transparent. In one embodiment, the combination of the coating layer and conductive plugs may be as a whole able to transmit light that is substantially similar to the light transmission of the nanostructure layer. In other embodiments, the light transmission of the combination may be any amount that allows visible light to be transmitted through the layered structure such that as a whole the layered structure is substantially optically clear. Thus, in some embodiments, the light transmission of the combination may substantially exceed or limit the light transmission of the nanostructure layer. For instance, in one embodiment, conductive plugs are distributed along the perimeter of the structure, thereby limiting the transparency of the structure at the perimeter while a center portion remains suitably transparent. It is to be appreciated that the size and/or the quantity of the conductive plugs may reduce the transparency of the structure.

Figure 6A:
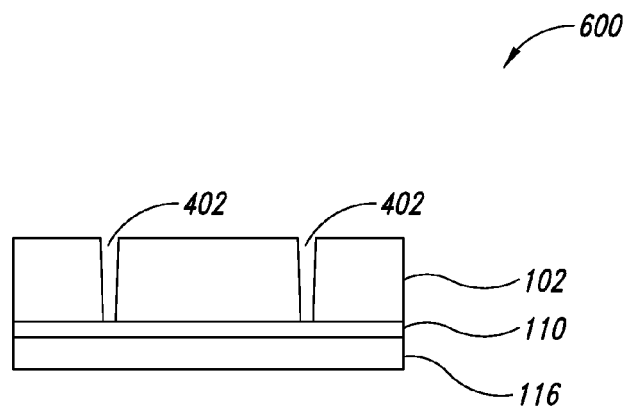
FIG. 6A is a side view of a structure having voids in the coating layer in accordance with aspects of the present disclosure.

In some embodiments, the conductive plugs 204 are added to the coating layer 102 by first forming voids 402 in the coating layer 102 and later filling a portion or all of the voids 402 with conductive material 404 thereby forming the conductive plugs 204 as shown in structure 600 in FIGS. 6A and 6B. The structure 600 is similar to the structure 400 in FIG. 4, except that the conductive plugs 204 in structure 600 are formed by filling voids 402 in the coating layer. Various techniques of forming the voids 402 will be explained in more detail below. In some embodiments, the voids 402 are formed in the contact areas 310 (FIG. 5) of the coating layer 102, while in other embodiments the voids 402 are formed throughout the outer surface 104 of the coating layer 102. As shown by FIG. 6A, the voids 402 formed in the coating layer extend through the thickness of the coating layer 102 exposing a surface area of the nanostructure layer 110 or conductive film below. The voids may have any aspect ratio, and the width of the voids may be similar to, much larger than, or much smaller than the thickness of the coating layer. In one embodiment, the exposed surface area of the nanostructure layer is less than 1% of the contact area.

As indicated above, various techniques may be used to form voids in the coating layer. In one embodiment, the coating layer is formed during a wet deposition or coating process. Upon depositing the coating layer material onto the nanostructure layer during the wet deposition process, dewetting may occur, thereby creating voids in the coating layer. At least some of the voids may expose a surface area of the nanostructure layer. In some embodiments, dewetting is encouraged to create more voids in the coating layer. In general dewetting is favored by use of a higher surface tension solvent for the coating layer and lower surface energy for the nanostructure layer onto which the coating layer is formed. The extent of dewetting can be controlled additionally by the viscosity and drying rate of the coating layer solution. The number of dewetting spots may also optionally be controlled by inclusion in the coating layer solution of particles which act as nucleation sites for dewetting, or placement of such particles on the conductive layer surface before the coating layer is applied.

In another embodiment, voids are formed in the coating layer during a printing process, in which the voids are made in the coating layer at particular locations, such as in the contact areas of the coating layer. Any suitable printing method may be used, such as screen, inkjet, flexographic, gravure, pad, offset, gravure offset, or reverse offset printing. Advantageously, printing can provide voids according to a pattern to ensure, statistically, enough surface contacts can be made within a contact area. Similarly, voids may be made in predetermined areas. In another embodiment, the coating layer is formed with voids therein by forming the coating layer with removable plugs. That is, the coating layer material may be mixed with removable plugs prior to coating or depositing the coating layer material on the nanostructure layer. In that regard, as the coating layer material is formed, the removable plugs are randomly distributed throughout the coating layer material. Once the coating layer material is crosslinked or hardened, such as by UV curing, thermal curing, or drying, the removable plugs may be removed, such as by dissolution, to create voids in the coating layer. The removable plugs may comprise water soluble polymers, which have limited solubility in the organic solvents commonly used in coating solutions (such as esters, ketones, aromatics, fluorinated and chlorinated solvents, and alcohols). For example, a non-ionic polymer such as hydroxypropyl methyl cellulose, or an ionic polymer such as carboxymethyl cellulose or poly(acrylic acid) may be used as the removable plug. The water soluble polymers may be added to the overcoat solution in the form of dried particles, previously prepared with the desired particle size by a method such as spray drying, grinding, or milling, to form a solid particle dispersion. The particle size should be comparable to or larger than the intended dry film thickness of the overcoat, so that when the coating is dry, the plugs extend beyond the outer surface of the overcoat. Alternatively the water soluble polymers may be added to the overcoat solution in the form of an aqueous polymer solution, which is formed into an inverse emulsion or inverse suspension (sub-micron to micron diameter aqueous droplets suspended in the non-aqueous coating solvent) through mixing and addition of surfactant. Removal of the water during drying leads to solidification of these droplets and formation of plugs. A low molecular weight water-soluble substance with limited solubility in organic solvents may be used instead of a polymer, for example a carbohydrate such as sucrose. If the removable plug consists of a water soluble polymer, then the plug is preferably removed from the dry overcoat by rinsing with water to dissolve the removable plug.

Although water soluble polymers are preferred as the removable plugs, with water as the dissolving fluid used to remove the plugs, other types of polymers or low molecular weight substances (including water or organic solvents) may also be used, as long as they are immiscible with the main part of the coating solution, and can be selectively removed from the dried and cured coating by dissolution or evaporation.

As will be clear to those skilled in the art, the voids in the contact regions made be formed in an initially continuous coating layer by other techniques, such as laser ablation, plasma treatment, chemical etch, or a mechanical process such as scraping, abrading, cutting, etc. In all of these cases, the coating layer may not initially contain voids or precursors of voids, and coating layer material is selectively removed from the contact region by local application of a chemical, physical, or thermal stimulus, to allow contact. In yet another embodiment, the coating layer may be photosensitive such that when portions of the coating layer are exposed to light, those portions may be made soluble. If the coating layer comprises a pre-existing solid film material which is applied to the nanostructure layer, e.g. by lamination, then voids (holes) in the coating layer may be formed prior to its application by any of the above processes. Formation of holes by a punching process or by laser drilling are preferred.

Figure 6B:
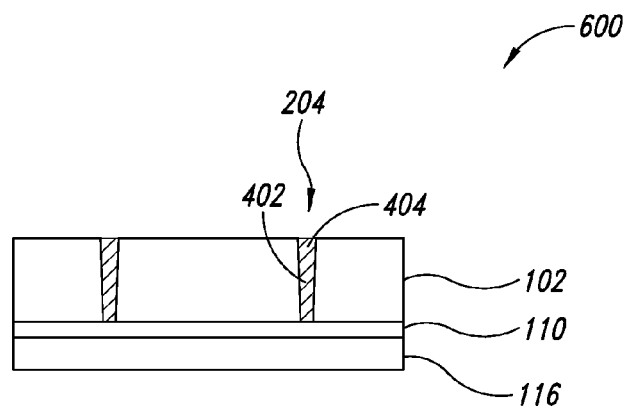
FIG. 6B is a side view of the structure in FIG. 6A illustrating the voids filled with conductive plugs.

As shown by FIG. 6B, once the voids 402 in the coating layer 102 have been formed, one or more of the voids 402 may be completely or partially filled with conductive material 404 to form the conductive plugs 204. It is to be appreciated that the conductive plugs 204 are coupled to the nanostructure layer 110 or another conductive feature, such as conductive film, and configured to be placed in electrical communication with one or more conductive structures in the nanostructure layer 110. As indicated above, the conductive material may be in a liquid, semi-liquid, or solid form and may comprise one or more nanoparticles. In one embodiment, the conductive material is Ag paste. It is to be appreciated that in some embodiments, any number of voids may be filled to establish surface contacts, including only one of many voids formed being filled with conductive material.

In one embodiment, the conductive plugs are added to the coating layer material prior to depositing the coating layer onto the nanostructure layer. That is, the conductive plugs are added to the coating layer material while in a liquid form. As the coating layer material is coated or formed onto a surface of the nanostructure layer, the conductive plugs are randomly distributed across the surface. For example, the conductive plugs may consist of electrically conductive particles that are mixed with the coating solution.

In other embodiments, the conductive plugs are added to the coating layer after coating layer deposition while the coating layer material is soft or displaceable. In one embodiment, prior to hardening the coating layer, such as by UV curing, thermal curing, drying, and the like, conductive plugs are added to the coating layer. The conductive plugs may be added with a force applied, such as gravity by dropping the plugs from an elevated height, or by being projected against the coating layer by some other means, such as ejection from a nozzle, or may be more dense than the coating layer material and thus displace the coating layer material once placed in contact with it. In one embodiment, the plugs are pushed with a force through at least a portion of the coating layer, such as by an applicator or other means. In another embodiment an electric or magnetic field is used to apply a force to the plugs. In one embodiment, after applying the coating layer to the layered structure but before fully hardening the coating layer, the layered structure is stored or otherwise not further processed for anywhere for up to 27 weeks prior to including the conductive plugs in the layered structure and fully hardening the coating layer. This advantageously allows the layered structure to be coated in a first manufacturing process and the conductive plugs to be added to the layered structure in an entirely separate manufacturing process.

In certain embodiments, the overcoat is a reflowable polymer. As used herein, "reflowable polymer" refers to any thermoplastic polymer or copolymer that becomes pliable above certain temperature and/or pressure, but can return to a solid state upon cooling or release of pressure. Reflowable polymer may also be softened or dissolved by a solvent, and return to a solid state when the solvent is removed. Reflowable polymers include, without limitation, polyacrylate, polyamide, polyethylene, polyvinyl acetate, polybutylene terephthalate, polyesters, polycarbonate, polyimide, polyurethane, and the like.

A preferred reflowable polymer is poly(methyl methacrylate) (PMMA). PMMA is widely available, relatively inexpensive, transparent, reflowable by many organic solvents or above a temperature of about 100° C., and provides environmental protection for silver nanowires. Examples of other polymers that can be used as a reflowable overcoat include Dianal MB 2752, available from Dianal America, Inc. and dissolved powder coating resins, such as EPON 2002 (a powder coating resin based on bisphenol A/epichlorohydrin epoxy resin), available from Momentive Specialty Chemicals Inc., which can be dissolved in, for example, diacetone alcohol.

Reflowable overcoat are preferably in the thickness range of 0.2 to 3 µm. For example, if contact is made by silver paste to a nanowire layer through a reflowable overcoat, then the reflowable overcoat can be softened or dissolved by the silver paste solvent, or by the solvent in combination with heat or pressure, providing sufficient flow in the overcoat to allow the Ag particles in the paste to fully penetrate the overcoat and make contact with the underlying nanowire layer. If contact is made by anisotropic conductive film (ACF) bonding, then the reflowable overcoat is melted by the heat involved in ACF bonding, and the ACF particles can penetrate through the melted overcoat under pressure to make contact with the underlying nanowire layer. The reflowable overcoat also allows electrical contact to be made by silver paste or ACF with very low contact resistance, even for very small contact pad sizes.

Reflowable overcoats can be applied using any coating or printing methods including, without limitation, spin coating, slot dye coating, screen printing, in jet printing, gravure printing, flexographic printing, reverse offset printing and transfer film methods. In applying PMMA as overcoat, it is preferable to dissolve the PMMA in an organic solvent such as esters, ketones or aromatics which may, but need not, be mixed with alcohols. In some embodiments, PMMA may be combined with propylene glycol methyl ether acetate ("PG-MEA") or methyl ethyl ketone ("MEK") before application.

If a reflowable overcoat is used on a nanowire conductive layer, it may be advantageous to improve the adhesion between the overcoat and the conductive layer. In some embodiments such adhesion can be improved by including adhesion promoters in either the overcoat or the nanowire layer. In one embodiment, adhesion can be improved by the addition of a crosslinker for one or more binder materials used in the nanowire layer. For example, and without limitation, if a cellulose ester or other polymer is used in the nanowire layer, a crosslinker for the cellulose ester or other polymer may be added to the overcoat. In one embodiment, HPMC is included as a binder in the nanowire layer and a blocked polyisocyanate such as Desmodur BL3175A from Bayer Materials Science (a trimer of hexamethylene diisocyanate, blocked with methyl ethyl ketone oxime), is added to the reflowable overcoat. In one embodiment, a PMMA reflowable overcoat is used and BL3175A is added to the overcoat at a level higher than about 2% relative to the PMMA and the overcoat is cured for about 15 minutes or more at 150° C. Such overcoat shows improved adhesion to the nanowire layer when compared to a PMMA overcoat without the blocked polyisocyanate or other adhesion promoters. In other embodiments, other HPMC crosslinkers can be used, such as other blocked or unblocked polyisocyanates, blocked or unblocked melamines, UV curable resins and epoxy compounds. In one embodiment, a UV curable resin includes HC-5619 UV-curable hard coat from Addison Clearwave Coatings, Inc. An example of a melamine based crosslinker is available from Cytec Surface Specialties SA/NV of Belgium under the tradename Cymel® 327. In another embodiment, Dianal MB 2752 is used with Desmodur BL3175A as a crosslinker.

In other embodiments, catalysts may also be included in the overcoat to increase the crosslinking reaction rate and/or lower the required cure temperature. In one embodiment such a catalyst includes dibutyltin dilaurate. In another embodiment, Epon 2002, available from Momentive Specialty Chemicals, Inc., can be combined with EPIKURE P 101 (an imidazole based curing agent for EPON 2002) to form a reflowable coating layer.

Reagents may also be included which will cause a direct chemical reaction between the PMMA and the HPMC at the interface, such as by transesterification. Exemplary transesterification catalysts include tin compounds (such as dibutyltin dilaurate or dibutyltin oxide) and titanates such as Tyzor compounds from DuPont.

Adhesion promoters which will improve the adhesion of the nanowire layer to the substrate may also be included within the overcoat or the nanowire layer itself. In one embodiment, if the substrate is glass, then silane coupling agents can be used. If the coupling agents are initially included in the overcoat (to avoid increasing the complexity or reducing the performance of the nanowire layer), they may diffuse out of the overcoat and through the nanowire layer to the substrate during a cure process and form a bond between the substrate and the nanowire layer.

In other embodiments, PMMA may not be included in a reflowable overcoat for the nanowire layer. In one embodiment, the overcoat may comprise a copolymer of methyl methacrylate with one or more other monomers (i.e., co-monomer). Any co-monomer that has a vinyl group is capable of forming co-polymers with methyl methacrylate. In addition to the vinyl group, the co-monomers may contain one or more reactive functional groups. After copolymerization, the reactive functional groups are incorporated into the copolymeric overcoat. The reactive function groups can be more easily reacted with the functional groups in the constituents of the nanowire binder, such as the hydroxyl groups of HPMC or other cellulose ester. Alternatively or in addition, the reactive functional groups of the copolymer may crosslink within the overcoat. Examples of the reactive functional groups may be hydroxyl, carboxylic acid, amino, glycidyl and the like.

In certain embodiments, the reflowable overcoat is a polymer or copolymer based on one or more types of acrylate monomer and/or co-monomer. The acrylate monomer or co-monomer may be represented by the following formula:

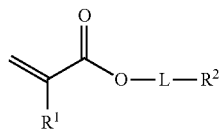

wherein, $R^1$ is hydrogen or alkyl,

L is a direct bond, an alkylene chain, (i.e., —$(CH_2)_n$—, wherein n is 1-10), or an alkylene oxide chain (i.e., —$(CH_2)_m$—$O)_n$—, m is 1-10, n is 1-10);

$R^2$ is hydrogen, hydroxyl, amino (including mono-, di-substituted amino), glycidyl, alkyl (substituted or unsubstituted), and aryl (substituted or unsubstituted). The substituents may be halo, hydroxyl, alkyl, amino, aryl, nitro, cyano, haloalkyl, and the like.

In one embodiment, the co-monomer may be a hydroxyl functional monomer such as hydroxyethyl methacrylate (HEMA), a carboxylate functional monomer such as methacrylic acid, an amine monomer such as diethylamino ethyl methacrylate, or an epoxy monomer such as glycidyl methacrylate. Various coupling agents may be used to react each of these functional groups with the hydroxyl groups in HPMC or a different reactive group in another binder polymer. Additionally, even without a coupling reaction, non-covalent interactions of the comonomer with the HPMC hydroxyl groups may be sufficient to adequately improve adhesion, such as through hydrogen bonding interactions.

In other embodiments, the coating layer material may have hardened prior to adding the conductive plugs. For instance, in one embodiment, after the coating layer has hardened, at least a portion of the coating layer may later be exposed to heat and/or solvents that cause the coating layer to become sufficiently fluid by an amount suitable to insert the conductive plugs as described above. In yet another embodiment, conductive plugs may be heated or exposed to a solvent prior to adding them to the coating layer. The heated or solvent soaked conductive plug may be configured to cause a portion of the coating layer to reflow when the conductive plug is placed in contact with or pressed against the coating layer. In this embodiment, the conductive plugs a force may be applied to assist with causing the coating layer to receive the conductive plug such that the conductive plug makes contact with the nanostructure layer.

After the conductive plug has been inserted into a previously hardened coating, which has been softened as described above to allow insertion of the plug, the coating layer may be re-hardened by removal of the solvent or lowering of the temperature, as will occur if the coating layer is a non-crosslinkable thermoplastic polymer. In other embodiments, the coating layer is crosslinked after the plugs are inserted into the softened coating, such that the coating layer has improved hardness, adhesion, or chemical resistance. Suitable coating materials which can be used for this type of process are commonly available for applications such as powder coating, fiber/resin composites, sealants, and adhesives, and are in some instances known as "B-staged" or "B-stageable" resins. Chemistries suitable for this purpose include, but are not limited to, acrylate, silicone-epoxy, siloxane, novolac, epoxy, urethane, silsesquioxane, or polyimide The crosslinking step may be accomplished by heat, radiation, additional chemical stimulus, or a combination of these. For example, the coating material may comprise a solid resin with heat-activated crosslinking functionality; silver paste contacts may be deposited prior to crosslinking, and crosslinking may be accomplished during the same heating step used to cure the silver paste contacts, or in a subsequent heating step. Alternatively crosslinking may be accomplished by exposure to UV radiation after electrical contact has been established by insertion of the conductive plugs.

Figure 7:
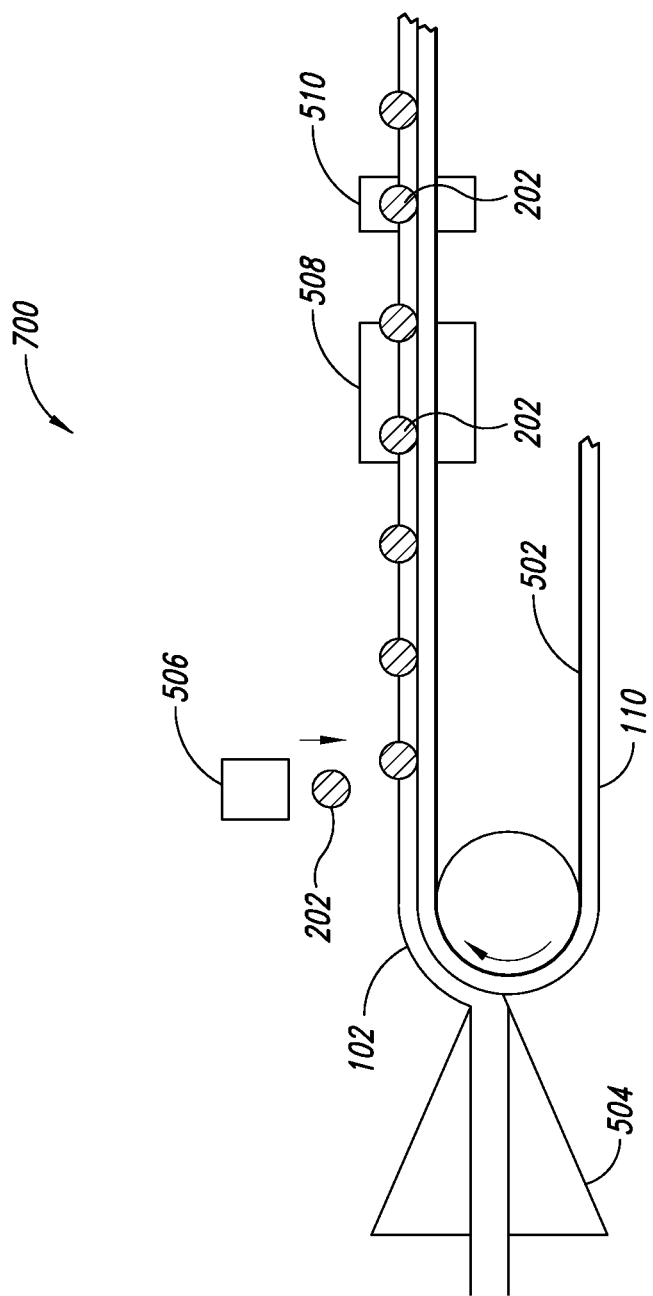
FIG. 7 is a system for forming a structure in accordance with aspects of the present disclosure.
Figure 8:
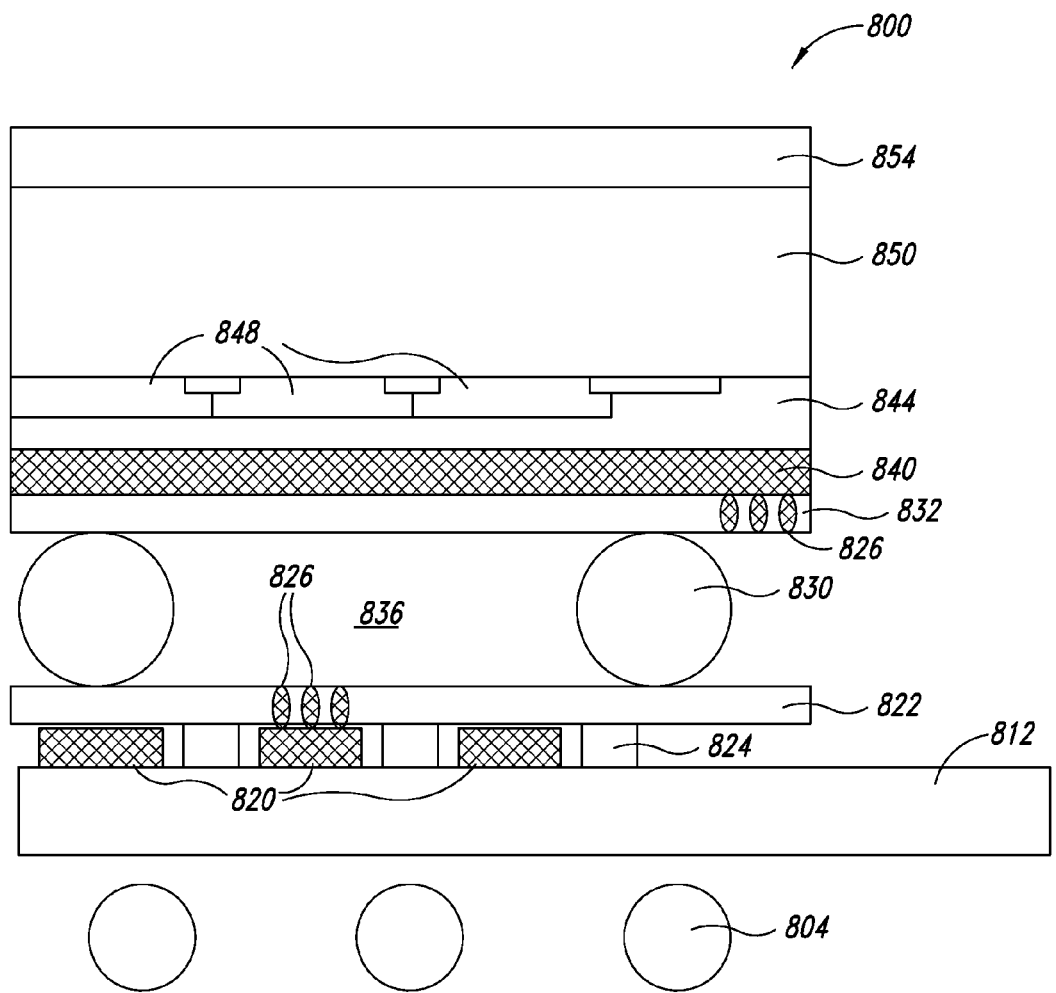
FIG. 8 is a display incorporating a layered structure in accordance with aspects of the present disclosure.

Turning now to FIG. 7, there is shown a system 700 for forming conductive plugs in the coating layer of a structure in accordance with one embodiment of the present disclosure. The system 700 includes a roll-to-roll processing line for conveying a moving web of film material through various process steps. The film material may include the nanostructure layer and/or the substrate. The system 700 further includes a slot die coating head 504 for depositing the coating layer 102 on the first surface 108 of the nanostructure layer 110.

The system 700 further includes a conductive plug applicator 506 configured to provide a conductive plug 204 to the outer surface 104 of the coating layer 102. In one embodiment, the applicator comprises a nozzle for applying drops of a conductive ink or paste. By controlling the timing of drop deposition relative to the motion of the web, the conductive plugs can be placed with a desired spacing or at a set of desired positions. The nozzle may also be moved laterally across the web, or more than one nozzle may be used at different cross-web or down-web positions. The nozzle may also be used to form a continuous straight or curved line of conductive plug material. In another embodiment the conductive plug may be a piece of solid conductive material, such as e.g. a metal disk or ball, and the applicator places and applies a force to the conductive plug 204. For example, small/thin metal discs can be individually positioned on the moving web and pressed against it to penetrate the still-soft coating layer and make contact with the nanostructure layer, using, for example, pick and place tooling or the like. In some embodiments, the metal discs deform due to the force being applied such that a portion, such as a center portion, makes contact with the nanostructure layer and the side portions form along the sidewalls of a void formed in the coating layer. As described above, the conductive plug 204 displaces the flowable coating layer 102 and makes physical contact with the nanostructure layer 110 or the conductive bonding material therebetween. In the illustrated embodiment, the system 700 further includes a dryer 508 and a UV cure lamp 510 configured to harden the coating layer. It is to be appreciated, however, that the type of technique (including air drying) used to cause the coating layer 102 material to harden will depend on the type of material used for the coating layer. In another embodiment, the coating layer 102 may go through a drying or UV curing prior to adding the plugs so long as the plug displaces the coating layer material sufficient to make contact with the nanostructure layer or the conductive bonding material below.

Turning now to 8, there is shown a schematic of a display, such as an LCD device 800. A backlight 804 projects light through a bottom substrate 812. The bottom substrate 812 may be a glass substrate, a polarizer, or a combination thereof. A plurality of first transparent conductor strips 820 are positioned between the bottom substrate 812 and a first alignment layer 822. The first transparent conductor strips 820 may form the conductive nanostructure layer. Each transparent conductor strip 820 alternates with a data line 824. The first alignment layer 822 may be a coating layer and have one or more conductive plug 826 formed therein.

Spacers 830 are provided between the first alignment layer 822 and a second alignment layer 832, the alignment layers sandwiching liquid crystals 836 in between. The second alignment layer 832 may be a coating layer and have one or more conductive plug 826 formed therein. A plurality of second transparent conductor strips 840 are positioned on the second alignment layer 832, the second transparent conductor strips 840 orienting at a right angle from the first transparent conductor strips 820.

The second transparent conductor strips 840 may be further coated with a passivation layer 844, colored matrices 848, a top glass substrate 850 and a polarizer 854. The transparent conductor strips 820 and 840 can be patterned and transferred in a laminating process onto the bottom substrate, and the alignment layer, respectively. Unlike the conventionally employed metal oxide strips (ITO), no costly deposition or etching processes are required.

Figure 9:
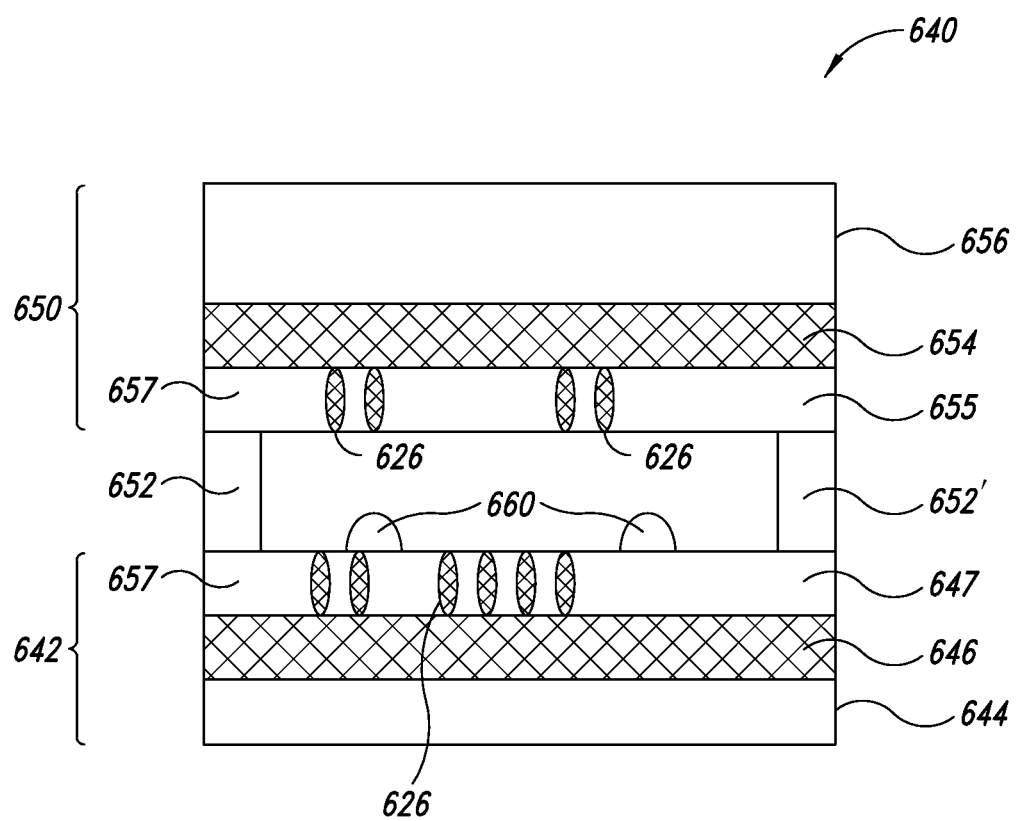
FIG. 9 is a touch screen device incorporating a layered structure in accordance with aspects of the present disclosure.

Turning now to FIG. 9, there is shown a schematic illustration of a resistive touch screen device 640. The device 640 includes a bottom panel 642 and an upper panel 650. The bottom panel 642 comprises a layered structure that includes a first substrate 644 coated or laminated with a first conductive layer 646, and a first coating layer 647 thereon. The first coating layer 647 has one or more conductive plugs 626 therein. The upper panel 650 includes a layered structure that includes a second conductive layer 654 coated or laminated on a second substrate 656, and a second coating layer 655 thereon. The second coating layer 655 has one or more conductive plugs 626 therein. Although only a few conductive plugs 626 are shown, it is to be understood that the first and second coating layers 647 and 655 may include more conductive plugs than are illustrated.

The upper panel 650 is positioned opposite from the bottom panel 642 and separated therefrom by adhesive enclosures 652 and 652' at respective ends of the device 640. A surface of the conductive plugs 626 in the first coating layer 647 face a surface of the conductive plugs 626 in the second coating layer 655 which may be suspended over spacers 660.

When a user touches the upper panel 650, the conductive plugs 626 of the second coating layer 655 in the top panel 650 and the conductive plugs of the first coating layer in the bottom panel 642 come into electrical contact. A contact resistance is created, which causes a change in the electrostatic field. A controller (not shown) senses the change and resolves the actual touch coordinate, which information is then passed to an operating system. The conductive plugs 626 can also or alternatively be used to connect conductive layers 646 and 654 to external driving circuitry.

According to this embodiment, either or both first and second conductive layers are based on conductive nanowire layers, as described herein. The surface of the first and second coating layers 647 and 655 may each have a surface resistivity in the range of about 10-1000Ω/□, more preferably, about 10-500Ω/□. Optically, the upper and bottom panels may have high transmission (e.g., >85%) to allow for images to transmit through.

Various embodiments for forming the nanostructures (nanowires) and nanostructure layers described herein are further illustrated by the following non-limiting examples.

EXAMPLES

Example 1

Synthesis of Silver Nanowires

Silver nanowires were synthesized by the reduction of silver nitrate dissolved in ethylene glycol in the presence of poly(vinyl pyrrolidone) (PVP) following the "polyol" method described in, e.g., Y. Sun, B. Gates, B. Mayers, & Y. Xia, "Crystalline silver nanowires by soft solution processing," *Nanoletters* 2(2): 165-168, 3002. A modified polyol method, described in co-pending and co-owned U.S. Pat. No. 8,454,721, produces more uniform silver nanowires at higher yields than does the conventional "polyol" method. This application is incorporated by reference herein in its entirety. Resulting nanowires primarily had lengths from about 13 μm to about 17 μm and diameters from about 34 nm to about 44 nm.

Example 2

Standard Preparation of Coating Composition of Conductive Nanostructures

A typical coating composition for depositing metal nanowires comprises, by weight, from 0.0025% to 0.1% surfactant (e.g., a preferred range is from 0.0025% to 0.05% for ZONYL® FSO-100), from 0.02% to 4% viscosity modifier (e.g., a preferred range is 0.02% to 0.5% for hydroxypropyl methylcellulose (HPMC), from 94.5% to 99.0% solvent and from 0.05% to 1.4% metal nanowires.

The coating composition can be prepared based on a desired concentration of the nanowires, which is an index of the loading density of the final conductive film formed on the substrate.

The coating composition can be deposited on a substrate according to, for example, the methods described in co-pending U.S. Pat. No. 8,049,333.

As understood by one skilled in the art, other deposition techniques can be employed, e.g., sedimentation flow metered by a narrow channel, die flow, flow on an incline, slit coating, gravure coating, microgravure coating, bead coating, dip coating, slot die coating, and the like. Printing techniques can also be used to directly print an ink composition onto a substrate with or without a pattern. For example, inkjet, flexoprinting and screen printing can be employed. It is further understood that the viscosity and shear behavior of the fluid as well as the interactions between the nanowires may affect the distribution and interconnectivity of the nanowires deposited.

A sample conductive nanostructure dispersion was prepared that comprised silver nanowires as fabricated in Example 1 dispersed, a surfactant (e.g., Triton), and a viscosity modifier (e.g., low molecular-weight HPMC) and water. The final dispersion included about 0.4% silver and 0.4% HPMC (by weight). This dispersion can be used (neat or diluted) in combination with a light-scattering material (e.g., in a particulate form) directly to form a coating solution. Alternatively, the dispersion can be combined with a dispersion of a light-scattering material to form a coating solution.

Example 3

ACF Contact Through Thick Thermoplastic Overcoat

A transparent conductive layer with a thermoplastic overcoat was prepared as follows. An ink was prepared containing 0.4 wt % silver nanowires, 0.4% HPMC (Methocel K100), and 250 ppm surfactant (Triton X100). The ink was coated onto 2" square pieces of clean glass (Eagle XG) by spin coating at 1000 rpm, drying at 50 degrees C. for 90 seconds, and baking at 140 degrees C. for 90 seconds, resulting in a coating with a sheet resistance of 14 ohms/square. PMMA (MW=120,000 gm/mol) was dissolved in PGMEA at a concentration of 5%, 10%, or 15%, and coated at spin speeds of 500 and 1000 rpm, in each case for 30 seconds. The samples with overcoat layer were dried at 50 degrees C. for 90 seconds, then baked at 140 degrees C. for 10 minutes to remove the solvent and anneal the film. After baking, the overcoat forms a hard, solid, transparent layer. There was no change in the sheet resistance after applying the overcoat, as measured by a non-contact technique; however after applying the overcoat, it was no longer possible to make electrical contact to the conductive layer with probes, due to the presence of the overcoat. The overcoat thicknesses for the different concentration/spin speed combinations were determined by preparing similar PMMA coatings on glass (without a nanowire layer) and measuring the thickness with a KLA Tencor AlphaStep profilometer.

ACF bonding was done using Sony CP8016K-45AC anisotropic conducting adhesive tape. The tape contains 6 µm diameter solid nickel particles. The bonding conditions were a peak temperature of 182 degrees C., a bonding time of 10 seconds at the peak temperature, and a pressure in the range 3-6 MPa (variable between experiments). The bond was made between the unpatterned overcoat/nanostructure film, and a flexible printed circuit (FPC) connector with 80 µm wide contact pads spaced at a 140 µm pitch. The contact pads were 18 µm thick copper with Ni/Au plating. In this example, the individual ACF particles comprise 'conductive plugs', and the area of each contact comprises the 'contact area'.

The bonds were electrically characterized by using a multimeter to measure the two-point resistance between adjacent probe points on the FPC, such that the current from the meter passes through one contact into the transparent conducting layer, then out of the transparent conducting layer through the other contact. The measured resistance includes the test leads, FPC connector, contact resistances, and the resistance of the transparent conductor. values for the two-point resistances for different samples are reported in table 1. For overcoat thickness from 0 to 900 nm, the two-point resistances are all below 10 ohms, and there is very little increase in Rc with increasing overcoat thickness. At 1.8 µm thickness, the two-point resistances are mostly between 10 and 100 ohms, with some reading >1 kOhm; and at 2.6 µm thickness, the two-point resistances are mostly in the hundreds of ohms, again with some reading >1 kOhm. The resistance is consistently higher between pads 5-6 due to a larger distance between the contacts, and the consistently higher resistances between pins 1-2 and 2-3 may indicate an anomaly in the bond head or the FPCs at position 2 (such as uneven pressure).

To try to improve the contact with a 2.6 µm thick overcoat, the bonding conditions were modified. Higher pressure was used (4 or 5 MPa), and the temperature ramp rate (from RT to the bonding temperature) was slowed down to provide a longer time interval above the glass transition temperature of PMMA before curing of the ACF adhesive, to give the ACF particles more time to move through the thicker overcoat and come in contact with the nanostructure layer. The results show that it is possible to further improve the contact with a thicker thermoplastic overcoat by modifying the process conditions.

TABLE 1

Two-point resistances for different samples

| Sample # | Wt % PMMA | Spin Speed, rpm | Overcoat thickness | Process comments | pins 1-2 | pins 2-3 | pins 3-4 | pins 4-5 | pins 5-6 | pins 6-7 | pins 7-8 | pins 8-9 | pins 9-10 |
|---|---|---|---|---|---|---|---|---|---|---|---|---|---|
| 1 | NA | NA | NA | | 3 | 75,000 | 3 | 3 | 14 | 3 | 3 | 3 | 3 |
| 2 | 5% | 1000 | 200 nm | | 3 | 3 | 3 | 3 | 13 | 3 | 3 | 3 | 3 |
| 3 | 5% | 500 | 300 nm | | 4 | 4 | 4 | 4 | 15 | 4 | 4 | 4 | 4 |
| 4 | 10% | 1000 | 600 nm | | 11K | OL | 5 | 5 | 18 | 4 | 5 | 4 | 4 |
| 5 | 10% | 500 | 900 nm | | 8 | OL | 7 | 6 | 22 | 5 | 7 | 7 | 5 |
| 6 | 15% | 1000 | 1.8 um | | 30 | 41 | 17,000 | 33 | 58 | 26 | 33 | 39 | 5,500 |
| 7 | 15% | 500 | 2.6 um | | 2,400,000 | 1,200 | 47 | 4,200 | 87 | 4,650 | 248 | 117 | 608 |
| 8 | 15% | 500 | 2.6 um | P = 4 MPa | 580,00 | 354 | 269 | 113,000 | 730,000 | 5,000 | 10,500 | 209 | 186 |
| 9 | 15% | 500 | 2.6 um | P = 5 MPa | 20,300 | 59,500 | 500,000 | 212 | 850 | 127 | 40 | 285 | 295 |
| 10 | 15% | 500 | 2.6 um | Slow ramp, 5 MPa | 341 | 55 | 351 | 353 | 110 | 238 | 122 | 248 | 116 |

TABLE 1-continued

Two-point resistances for different samples

| Sample # | Wt % PMMA | Spin Speed, rpm | Overcoat thickness | Process comments | Two-point resistance, Ohms | | | | | | | | |
|---|---|---|---|---|---|---|---|---|---|---|---|---|---|
| | | | | | pins 1-2 | pins 2-3 | pins 3-4 | pins 4-5 | pins 5-6 | pins 6-7 | pins 7-8 | pins 8-9 | pins 9-10 |
| 11 | 15% | 500 | 2.6 um | Slow ramp, 6 MPa | 657 | 1,340 | 279 | 255 | 1,790 | 2,280 | 6,030 | 856 | 826 |

Example 4

AG Paste Contact Through a Thick Thermoplastic Overcoat

A transparent conductive layer with a thermoplastic overcoat was prepared as follows. An ink was prepared containing 0.1 wt % silver nanowires, 0.2% HPMC (Methocel K100), and 250 ppm surfactant (Triton X100). The ink was coated onto 4" square pieces of clean glass (Eagle XG) by spin coating at 750 rpm, drying at 50 degrees C. for 90 seconds, and baking at 140 degrees C. for 90 seconds, resulting in a coating with a sheet resistance of approximately 150 ohms/square. PMMA (MW=120,000 gm/mol) was dissolved in PGMEA at a concentration of 5%, 7.5%, 10%, and 15%, and coated at various spin speeds, in each case for 30 seconds. The samples with overcoat layer were dried at 50 degrees C. for 90 seconds, then baked at 110 degrees C. for 5 minutes to remove solvent and anneal the overcoat. There was no change in the sheet resistance after applying the overcoat, as measured by a non-contact technique; however after applying the overcoat, it was no longer possible to make electrical contact to the conductive layer with probes, due to the presence of the overcoat. The overcoat thicknesses for the different concentration/spin speed combinations were determined by preparing similar PMMA coatings on glass and measuring the thickness with a KLA Tencor AlphaStep profilometer.

Figure 10:
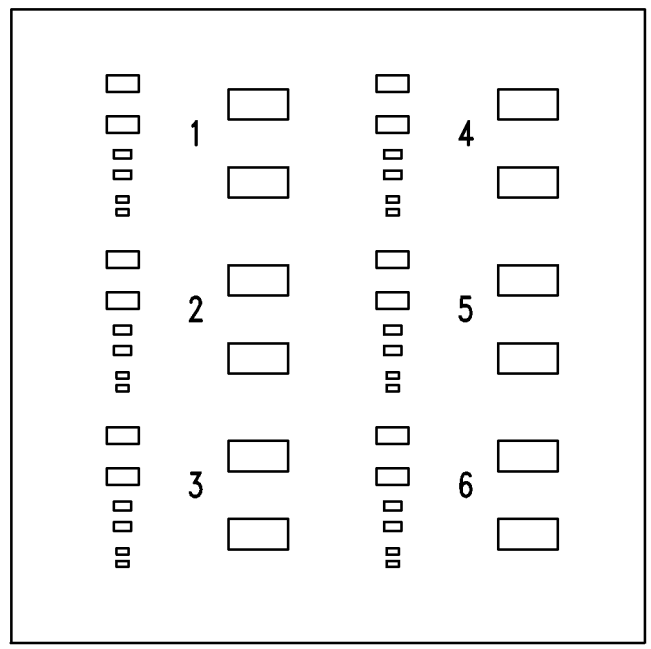
FIG. 10 is a top view of a structure illustrating an exemplary contact pad layout in accordance with aspects of the present disclosure.

Silver paste contacts were formed on the coated substrates as follows. The paste used was Toyobo DW-117H-41T05. Pairs of rectangular Ag paste contacts were printed, with the individual contacts measuring $1 \times 2$ mm$^2$, $2 \times 4$ mm$^2$, or $4 \times 8$ mm$^2$. Six contact pairs of each size were printed on each substrate (18 pairs total), as shown in FIG. 10. A stainless steel 250 mesh screen with a 0.0005" thick emulsion was used for screen printing. The distance between the two contacts in a pair is varied proportionally to the size of the contacts in that pair, and if the contact resistance is negligible, then the two-point resistance comes primarily from the nanowire layer and is independent of the pad size. After printing, the samples were baked in a convection oven at 130 degrees C. for 30 minutes to cure the silver paste and allow them to penetrate through the overcoat. After curing and cooling the samples, the resistance was measured for all pairs of same-sized contacts, and the results are shown in Table 2. The data show that electrical contact can be made even through a 2.5 μm thick PMMA overcoat, with only a small amount of contact resistance increase for the thickest overcoats and smallest contact pads.

FIG. 10 illustrates contact pad layout for Example 4. The small rectangles are the silver paste pads, deposited by screen printing. The two-point resistance is measured for pairs of adjacent same-sized pads. Numbers indicate contact 'group' number, the six groups are replicates (same sized pads and distances). Pad sizes $4 \times 8$, $2 \times 4$, $1 \times 2$, and $0.5 \times 1$ mm$^2$. $0.5 \times 1$ mm$^2$ pads are difficult to measure manually and data were not recorded.

TABLE 2

Resistance was measured for all pairs of same-sized contacts

| | Contact pad dimensions | PMMA thickness (nm) | | | | | | | |
|---|---|---|---|---|---|---|---|---|---|
| Pair # | (mm × mm) | 200 | 400 | 600 | 800 | 1000 | 1500 | 2000 | 2500 |
| 1 | 1 × 2 | 63.8 | 68.6 | 69.0 | 69.3 | 69.7 | 79.2 | 79.7 | 93.2 |
| 2 | 1 × 2 | 71.8 | 83.0 | 78.7 | 77.8 | 77.3 | 78.3 | 88.3 | 100.4 |
| 3 | 1 × 2 | 71.6 | 79.2 | 78.2 | 79.0 | 77.5 | 79.3 | 94.0 | 122.0 |
| 4 | 1 × 2 | 60.3 | 64.5 | 69.1 | 69.4 | 69.8 | 72.6 | 95220.0 | 84.5 |
| 5 | 1 × 2 | 61.9 | 59.5 | 81.8 | 74.3 | 79.0 | 84.3 | 94.3 | 97.6 |
| 6 | 1 × 2 | 62.0 | 62.2 | 68.8 | 59.2 | 66.3 | 64.9 | 72.7 | 88.7 |
| 1 | 2 × 4 | 62.3 | 68.5 | 68.8 | 65.7 | 63.4 | 67.4 | 68.5 | 74.2 |
| 2 | 2 × 4 | 73.2 | 78.3 | 75.6 | 73.7 | 75.2 | 76.2 | 79.1 | 84.3 |
| 3 | 2 × 4 | 68.0 | 69.4 | 68.3 | 69.4 | 68.1 | 72.3 | 74.7 | 82.8 |
| 4 | 2 × 4 | 58.2 | 59.1 | 66.7 | 60.5 | 62.9 | 60.8 | 64.2 | 67.7 |
| 5 | 2 × 4 | 62.5 | 60.6 | 62.4 | 62.2 | 71.7 | 70.1 | 67.8 | 73.5 |
| 6 | 2 × 4 | 60.0 | 58.9 | 60.6 | 57.6 | 59.7 | 58.2 | 62.8 | 70.5 |
| 1 | 4 × 8 | 59.4 | 62.5 | 62.7 | 59.4 | 61.9 | 62.4 | 64.3 | 64.8 |
| 2 | 4 × 8 | 69.9 | 76.9 | 73.0 | 73.3 | 70.7 | 74.7 | 74.9 | 78.9 |
| 3 | 4 × 8 | 64.2 | 66.3 | 63.8 | 62.3 | 62.0 | 67.6 | 66.9 | 70.1 |
| 4 | 4 × 8 | 67.4 | 67.2 | 70.4 | 67.0 | 68.7 | 69.7 | 71.2 | 73.7 |
| 5 | 4 × 8 | 70.8 | 72.5 | 78.7 | 70.8 | 75.5 | 73.6 | 73.5 | 73.4 |
| 6 | 4 × 8 | 63.4 | 62.0 | 64.2 | 62.0 | 63.4 | 64.3 | 75.1 | 63.6 |

Numbers in the main part of the table are two-point resistance in ohms.

Example 5

Contact Through a Thick Layer of Un-Cured Overcoat, Followed by UV Curing

A silver nanowire ink was prepared containing 0.1% silver nanowires, 0.2% HPMC (Methocel K100), and 250 ppm surfactant (Triton X100). The ink was spin coated at 750 rpm for 60 seconds onto 2" square pieces of clean soda lime glass. After spin coating, the nanowire layer was dried for 90 seconds at 50 degrees C. and then baked at 140 degrees C. for 90 seconds. An overcoat coating solution was prepared consisting of 40 wt % Addison Clearwave HC-5619 [a UV-curable acrylic coating] in a 50:50 mixture of isopropyl alcohol and diacetone alcohol. The overcoat was deposited on top of the nanowire layer by spin coating at 600 rpm for 10 seconds. The overcoated samples were dried at 50 degrees C. for 4 minutes and 130 degrees C. for 2 minutes.

In a comparative example, the overcoat was then cured by passing it three times through a Fusion UV curing system, with an H-bulb light source and a belt speed of 20 feet per minute. The total UV exposure after three passes (UVA+UVB) was approximately 3.6 J/cm$^2$. After curing the overcoat was clear, dry, and hard, and could be rubbed vigorously with an alcohol-soaked wipe without damage. Toyobo DW-117H-41T05 silver paste was mixed with dibasic esters at a ratio of 1.3:1, and drops of the diluted paste were manually applied to the surface of the UV-cured overcoat, a few millimeters away from the edges of the substrates. The individual drops were well separated from each other and not in mutual physical contact. The silver paste was then cured by baking at 130 degrees C. for 30 minutes in a convection oven.

In an inventive version of the above example, the above procedures were also followed, except that UV curing was done after application of the silver paste, instead of before. In other words, the silver paste was applied to the surface of an overcoat layer which had been dried, but not yet UV cured.

The sheet resistance after coating and baking of the nanowires was measured as approximately 95-100 ohms/square for all samples, as measured by a Delcom non-contact sheet resistance meter. After UV curing of the overcoat, the non-contact sheet resistance for all samples was increased to approximately 130-140 ohms/square. For the samples prepared by the method of the comparative example, all of the silver paste contacts were electrically isolated from one another. This was demonstrated by contacting pairs of silver paste contacts with probes and measuring the electrical resistance. The resistance was off scale (not measurable) for all pairs tested. For the inventive example, by contrast, all pairs of silver paste contacts were electrically connected to each other, with a typical two-point resistance of 160-180 ohms. Since the contacts were physically separated from each other, it can be inferred that electrical contact between the contacts took place through the nanostructure layer, which was in electrical communication with the contacts.

Samples from both the inventive and comparative examples were each fractured through one of the electrical contacts, and a cross section was examined in a scanning electron microscope. In the comparative example, it was seen that the silver paste sits on top of the overcoat and is not in physical contact with substrate surface, where the nanowire layer is located. In the inventive example, it can be seen that the silver paste has penetrated and/or mixed with the overcoat, and is in physical contact with the substrate surface where the nanowire layer is located.

Example 6

Contact with Thick Laminate Covering Layer

Preparation of transparent conducting films for Example 6. Transparent conductive nanostructures layer was prepared as follows. The ink composition was 0.1% Ag nanowires, 0.2% HPMC (Methocel K100), and 250 ppm Triton X100. The ink was spin coated onto 4" square pieces of PET film (125 μm thick, no hardcoat) at 500 rpm. The films were taped to a piece of glass for spin coating. After spin, the samples were allowed to air dry for 5 minutes, then were baked in an oven at 100 degrees C. for 10 minutes. The non-contact sheet resistance for all samples was measured and was between 90 and 100 ohms/sq.

Example 6a

To one of the nanowire/PET films 910 prepared as above, three silver paint contacts (Pelco colloidal silver) 912 were applied manually as shown in FIG. 11A. The contact diameter was between 0.5-1 cm. The contacts were dried in a 100 degrees C. oven for 30 minutes. The film was then removed from the glass carrier. A 3"×5" piece of PET film 914, with optically clear adhesive and protect film, was prepared. With the protect film still in place, three square holes 916 were cut in the film with a razor blade as shown in FIG. 11B. The size of the holes was approximately 5 mm. The protect film was then removed, and the laminate cover layer with holes was laminated to the NW/PET film as shown in FIG. 11C, using a rubber roller. The previously applied Ag paint contacts were completely covered by the laminated film.

After lamination, the film was cut with the cut line 918 passing through the previously applied Ag paint contacts, which are hereafter referred to as 'buried contacts'. Then additional Ag paint contacts were applied as shown in FIG. 11D. The contacts are divided into groups as follows:

Group 1: Ag paint is in physical contact with the surface of the nanowire layer, the edge of the laminate film, and the top surface of the laminate film.

Group 2: Ag paint is applied over the square holes in the laminate film, so that Ag paint is in physical contact with the surface of the nanowire layer exposed by the hole, the edges of the holes in the laminate film, and the top surface of the laminate film.

Group 3: applied to the surface of the laminate film, away from all edges and holes.

Group 4: applied to the cut edge of the laminate/PET bilayer and the adjacent top surface of the laminate layer, so that each Ag paint deposit wraps around the corner and is in contact with both the edge and top surface. Contacts 4A, 4C, and 4E were applied at the positions of the 'buried' Ag paste contacts, while contacts 4B, 4D, and 4F were applied at positions where there were no buried Ag paste contacts.

After applying the additional contacts, the film was dried at 70 degrees C. for 15 minutes. Then the electrical resistance between contact 1A and all other contacts was measured pair-wise with a multimeter and probes. In all cases the probe was placed in contact with the Ag paint on the top surface of the laminate film, not on the edges or on the exposed nanowire layer. The results show that all contacts in groups 1 and 2 are in mutual electrical contact and therefore in contact with the nanostructure layer; the contacts in group 3 are electrically isolated from the nanostructure layer; and the edge contacts in group 4 are either in contact with or isolated from the nanostructure layer, depending on whether they are applied adjacent to one of the 'buried' Ag paint contacts or not, respectively.

The occurrence of electrical contact for edge contacts deposited adjacent to buried contacts can have two causes. 1) The edge contact can be in direct electrical contact with the edge of the buried contact, which was exposed by cutting; and/or 2) the edge contact can be in direct contact with the nanostructure layer, via a gap between the nanowire layer and the laminate film caused by the finite thickness of the edge contact. To determine whether the second mechanism was possible, Example 6b was performed.

Example 6b

Figure 12B:
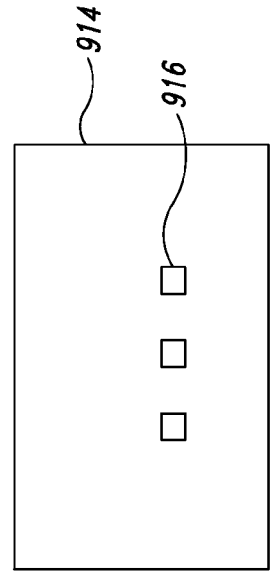
FIGS. 12A-12D illustrate an example used to form a structure in accordance with aspects of the present disclosure.
Figure 12D:
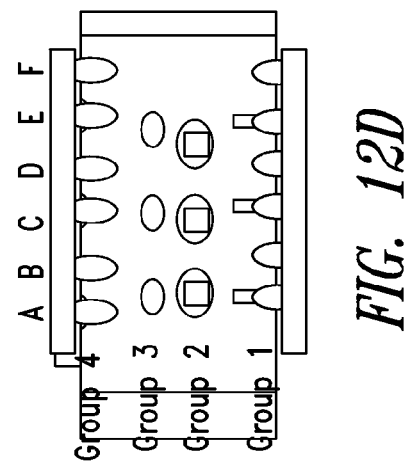
Figure 12A:
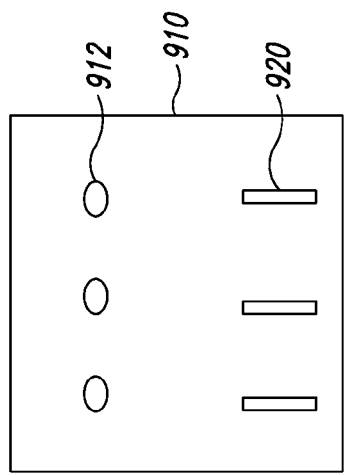

To one of the nanowire/PET films 910 prepared as above, three silver paint contacts (Pelco colloidal silver) 912 were applied manually as shown in FIG. 12A. The contact diameter was between 0.5-1 cm. The contacts were dried in a 100 degrees C. oven for 30 minutes. Narrow strips of adhesive-coated PET 920 were also applied to another part of the film.

Figure 12C:
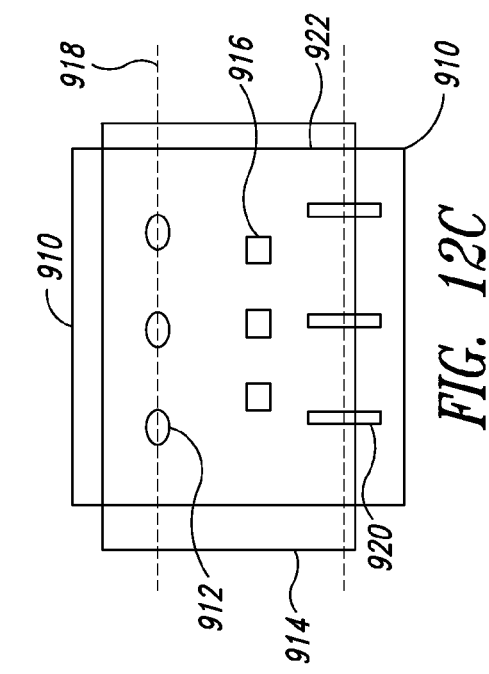

The film was then removed from the glass carrier. In reference to FIG. 12B, 3"×5" piece of PET film 914, with optically clear adhesive and protect film, was prepared. With the protect film still in place, three square holes 916 were cut in the film with a razor blade. The size of the holes was approximately 5 mm. The protect film was then removed, and the laminate cover layer with holes was laminated to the NW/PET film as shown in FIG. 12C, using a rubber roller. The previously applied Ag paint contacts were completely covered by the laminated film, and the previously applied PET/adhesive strips were partly covered.

After lamination, the film was cut, with one cutting line 918 passing through the previously applied Ag paint contacts, which are hereafter referred to as 'buried contacts', and a second cutting line 922 passing through the buried PET strips, which will hereafter be referred to as 'buried spacers'. Then additional Ag paint contacts were applied as shown in FIG. 12D. The contacts are divided into groups as follows:

Group 1: Edge/surface contacts, similar to Group 4 in Example 6a. Contacts 1A, 1C, and 1E were applied adjacent to the buried spacers, while contacts 1B, 1D, and 1F were not in contact with the buried spacers.

Group 2: As in example 6a.

Group 3: As in example 6a.

Group 4: As in example 6a.

After applying the additional contacts, the film was dried at 70 degrees C. for 15 minutes. Then the electrical resistance between contact 2A and all other contacts was measured pair-wise with a multimeter and probes. In all cases the probes were placed in contact with the Ag paint on the top surface of the laminate film. The results for groups 2, 3, and 4 are similar to Example 6A. In Group 1, two of the edge contacts adjacent to the buried spacers are in electrical contact with the nanostructure layer, while the edge contacts not adjacent to buried spacers are all electrically isolated. This indicates that an electrically insulating 'buried spacer' can also enable electrical contact between Ag paint and the nanostructure layer, possibly by opening up a gap between the nanostructure layer and the laminate film at the edge of the sample into which the Ag paint can flow.

Example 7

Edge Contact with a Thick UV-Cured Overcoat

A thick UV-cured overcoat layer was formed on a transparent conductive nanowire film as follows. The starting film (ClearOhm, Cambrios) had sheet resistance of 130 ohms/square and a 130 nm thick UV-cured overcoat. The substrate was 125 µm thick PET. The 130 nm overcoat layer is sufficiently thin such that electrical contact can be made. An additional thick UV-cured overcoat layer was coated on top as follows. A piece of the film was taped to a glass sheet for spin coating. A 40 wt % solution of HC-5619 in a 1:1 mixture of diacetone alcohol/isopropyl alcohol was spin coated on top of the film at 600 rpm for 10 seconds. The film was then dried for 1 minute on a hotplate at 50 degrees C., baked for 1 minute in an oven at 130 degrees C., and was then UV cured with the same equipment and process described in Example 3. Then the film was removed from the glass carrier by cutting away the taped edges with a razor blade.

Silver paint contacts (Pelco colloidal silver) were then applied to the edges of the sample (five contacts per edge or twenty edge contacts total). The edge contacts also extended to the top surface as in the previous examples. Ten contacts were also applied to the surface of the overcoat in the center of the film, away from the edges. The resistance between pairs of contacts was measured with a multimeter and probes. It was found that all edge contacts were in electrical contact with each other, with typical two-probe resistance of 500-700 ohms; and none of the top contacts was in electrical contact with each other or with any of the edge contacts. Since all contacts are physically isolated from each other, it can be concluded that all of the edge contacts and none of the surface contacts are in electrical contact with the nanowire layer.

Example 8

Increased Adhesion Overcoat Using Blocked Isocyanate

A transparent conductive layer with a thermoplastic overcoat was prepared as follows. An ink was prepared containing 0.15 wt % silver nanowires, 0.3% HPMC (Methocel K100), and 250 ppm surfactant (Triton X100). The ink was coated onto 5 4"×4" hardcoat PET substrates by spin coating at 1000 rpm. The films were dried at 50 degrees C. for 90 seconds, and baked at 140 degrees C. for 90 seconds, resulting in coatings with a sheet resistance of approximately 150 ohms/square. PMMA (MW=120,000 gm/mol) was dissolved in PGMEA at a concentration of 7.5% and the solutions further comprised 0%, 1%, 2.5%, 5% and 10% Desmodur BL3175A relative to the PMMA. Each Desmodur/PMMA/PGMEA combination was spin coated at 1000 rpm for 60 seconds onto the separate nanowire layers to produce overcoats of approximately 400 nm thickness. The samples were dried at 50 degrees C. for 90 seconds, then baked at 110 degrees C. for up to 15 minutes. A tape test similar to that described in ASTM 3359-02 was carried out on each sample. According to ASTM D 3359-02, a cross cut tool was used to prepare vertical and horizontal parallel cuts on the sample surface to make a cross hatch pattern. A pressure sensitive tape was then applied on the cross hatch pattern and pressure was applied to flatten the tape by using rubber erased on the back of a pencil. The tape was then peeled off after waiting for 90 seconds by pulling it off rapidly back over itself as close to an angle of 180°. The film surface was then inspected by microscope to see if any portion of the coating was peeled off in the test. If some portion of the coating is removed by the tape, the sample 'fails' the test. If no portion of the scored coating is removed, the sample 'passes'. The samples including 0%, 1% and 2.5% Desmodur BL3175A relative to the PMMA failed the tape test and the samples including 5% and 10% Desmodur BL3175A relative to the PMMA passed the tape test. This demonstrates improved adhesion when using amounts of the blocked polyisocyanate in excess of 5% relative to the PMMA.

Example 9

Increased Adhesion Overcoat Using UV Curable Resin

A transparent conductive layer with a thermoplastic overcoat was prepared as follows. An ink was prepared containing 0.1 wt % silver nanowires, 0.2% HPMC (Methocel K100), and 250 ppm surfactant (Triton X100). The ink was coated onto four, 4"×4" single side hardcoat PET substrate (substrates were taped to 5"×5" soda lime glass for spin coating using polyimide tape, ink coating was on the non-hard coated side) by spin coating at 750 rpm for 60 seconds. The film was then dried at 50 degrees C. for 90 seconds, and baked at 140 degrees C. for 90 seconds, resulting in a coating with a sheet resistance of approximately 150 ohms/square.

PMMA (MW=120,000 gm/mol) was dissolved in PGMEA at a concentration of 15 wt %. HC-5619, available from Addison Clearwave Coatings, Inc., was dissolved in PGMEA at concentration of 15 wt %. The two solutions were mixed quantitatively to achieve solutions containing 10%, 20%, and 80% HC-5619 relative to the PMMA. The final blended solutions were at a concentration of 15 wt % solids in PGMEA.

Each HC-5619/PMMA solution in PGMEA was spin coated at 1000 rpm for 60 seconds onto separate 4"×4" single side hardcoat PET substrate coated with nanowire layers previously (as mentioned in the above paragraph) to produce overcoats of approximately 2 μm thickness. The samples were dried at 50 degrees C. for 90 seconds, and then baked at 100 degrees C. for up to 10 minutes. The samples were then cured by exposing them to UV radiation under nitrogen blanket using Fusion UV system (model: DRS 120) installed with H-Bulb (UVA+UVB dose=1.6 J/cm$^2$) to achieve a non-tacky, crosslinked overcoat film.

A tape test similar to that described in ASTM D 3359-02 was carried out on each sample. According to ASTM D 3359-02, a cross cut tool was used to prepare vertical and horizontal parallel cuts on the sample surface to make a cross hatch pattern. A pressure sensitive tape was then applied on the cross hatch pattern and pressure was applied to flatten the tape by using rubber erased on the back of a pencil.

The tape was then peeled off after waiting for 90 seconds by pulling it off rapidly back over itself as close to an angle of 180°. The film surface was then inspected by microscope to see if any portion of the coating was peeled off in the test. If some portion of the coating is removed by the tape, the sample 'fails' the test. If no portion of the scored coating is removed, the sample 'passes'. The samples including 10%, 20% HC-5619 with respect to PMMA passed the tape test with no peeling of the coating demonstrating improvement in PMMA overcoat adhesion when 10-20% HC-5619 was added in the formulation. The sample with 80% HC-5619 with respect to PMMA failed the tape test.

Example 10

Increased Overcoat Adhesion Using Melamine Based Crosslinker

A transparent conductive layer with a thermoplastic overcoat was prepared as follows. An ink was prepared containing 0.1 wt % silver nanowires, 0.2% HPMC (Methocel K100), and 250 ppm surfactant (Triton X100). The ink was coated onto two, 4"×4" single side hardcoat PET substrate (substrates were taped to 5"×5" soda lime glass for spin coating using polyimide tape, ink coating was on the non-hard coated side) by spin coating at 750 rpm for 60 seconds. The film was then dried at 50 degrees C. for 90 seconds, and baked at 140 degrees C. for 90 seconds, resulting in a coating with a sheet resistance of approximately 150 ohms/square.

PMMA (MW=120,000 gm/mol) was dissolved in PGMEA at a concentration of 15 wt %. Cymel 327 was used as supplied (90 wt % non-volatiles in isobutanol). Cymel 327 was added quantitatively to achieve solutions containing 5%, and 10% Cymel 327 relative to the PMMA.

Each PMMA/Cymel 327 solution in PGMEA was spin coated at 1000 rpm for 60 seconds onto separate 4"×4" single side hardcoat PET substrate coated with nanowire layers previously (as mentioned in the above paragraph) to produce overcoats of approximately 2 μm thickness. The samples were dried at 50 degrees C. for 90 seconds, baked at 100 degrees C. for up to 10 minutes and then cured at 130 C for 30 minutes.

A tape test similar to that described in ASTM D 3359-02 was carried out on each sample. According to ASTM D 3359-02, a cross cut tool was used to prepare vertical and horizontal parallel cuts on the sample surface to make a cross hatch pattern. A pressure sensitive tape was then applied on the cross hatch pattern and pressure was applied to flatten the tape by using rubber erased on the back of a pencil.

The tape was then peeled off after waiting for 90 seconds by pulling it off rapidly back over itself as close to an angle of 180°. The film surface was then inspected by microscope to see if any portion of the coating was peeled off in the test. If some portion of the coating is removed by the tape, the sample 'fails' the test. If no portion of the scored coating is removed, the sample 'passes'. The samples including 5%, and 10% Cymel 327 with respect to PMMA passed the tape test with no peeling of the coating demonstrating improvement in PMMA overcoat adhesion when 5-10% Cymel 327 was added in the formulation.

Example 11

Reflowable Thick Overcoat with Good Contact Resistance and Improved Scratch Resistance A transparent conductive layer with a thermoplastic overcoat was prepared as follows. An ink was prepared containing 0.1 wt % silver nanowires, 0.2% HPMC (Methocel K100), and 250 ppm surfactant (Triton X100). The ink was coated onto eight, 4"×4" single side hardcoat PET substrate (substrates were taped to 5"×5" soda lime glass for spin coating using polyimide tape, ink coating was on the non-hard coated side) by spin coating at 750 rpm for 60 seconds. The film was then dried at 50 degrees C. for 90 seconds, and baked at 140 degrees C. for 90 seconds, resulting in a coating with a sheet resistance of approximately 150 ohms/square.

Dianal MB 2752 (MW=17,000 gm/mol), available from Dianal America, Inc. was dissolved in PGMEA at a concentration of 15 wt %. Desmodur BL 3575 (blocked isocynates crosslinker) was used as supplied (75 wt %). Desmodur BL 3575 was added quantitatively to Dianal MB 2752 solution to achieve solutions containing 30%, and 37.5% Desmodur BL 3575 relative to the Dianal MB 2752.

Each Dianal MB 2752/Desmodur BL 3575 solution in PGMEA was spin coated at 500 rpm for 60 seconds onto four separate 4"×4" single side hardcoat PET substrate previously coated with nanowire layers as described in Example 10 to produce overcoats of approximately 1.5 μm thickness. The samples were dried at 50 degrees C. for 90 seconds, and baked at 100 degrees C. for up to 10 minutes. One sample from each Dianal MB 2752/Desmodur BL 3575 formulation was used for printing silver paste contact for measuring qualitative contact resistance immediately after preparing.

Qualitative contact resistance was measured by screen printing rectangle patterns on a 4"×4" film prepared by the method mentioned above. The pattern contains pairs of 4 mm×8 mm, 2 mm×4 mm, 1 mm×2 mm, and 0.5 mm×1 mm contacts and the pattern is designed so that when contact resistance is 0, total resistance between 4×8 mm contacts is the same as between 2×4 mm contacts, and so on. So if a total resistance is higher for 1×2 mm contacts than for 4×8 mm contacts, the difference is caused by contact resistance. Toyobo DW-117-41T05 silver paste was used for printing the contacts using Affiliated Manufacturers Inc. (ami) MSP-485 screen printer installed with a rubber squeeze of 70 durometer hardness. A stainless steel screen with 250 mesh size was used for printing. After printing, the samples (including the silver paste and the Dianal MB 2752/Desmodur BL 3575 coatings) were cured at 130 degree C. for 30 minutes. The total resistance measurements were done by using Keithley system source meter using 0.1 mA current and 10V compliance limit. Smallest contacts (0.5×1 mm) were measured using a multimeter.

The remaining three samples for each Dianal MB 2752/Desmodur 3575 formulations were stored in individual 6"×6" polypropylene clam shell containers in a cabinet. One sample from each formulation was removed after storage time of 1.3 weeks (216 hrs), 7 weeks (1176 hrs) and 27.1 weeks (4560 hrs) and subjected to qualitative contact measurement procedure mentioned above. If the formulations are not stable, then there should be an increase in the total measured resistance indicating that the contact resistance of the top layer is increasing. The actual sheet resistances of the films were measured before screen printing to make sure that there was no increase in the sheet resistance of the films because of the storage.

As shown in Tables 3 and 4 below, the qualitative contact resistance data measured at 0, 1.3, 7 and 27.1 weeks for these films showed no significant differences in measure total resistance. Also total resistance measured for different contact pad sizes did not show any significant increase form large to small contact pad sizes (data shown in the table below). This indicates that the films were relatively stable upon storage (little or no crosslinking reaction happened) and could be cured after silver paste printing. The curing of the films was tested by wiping the film surface with a lab wipe wet with acetone and if the films were not cured properly then the coating could be easily wiped away. For all the films (stored at different times), the coating did not wipe away after wiping with acetone.

TABLE 3

| Contact Size (mm) | | Dianal MB 2752 + 30% Desmodur BL 3575 | | | |
|---|---|---|---|---|---|
| | | T = 0 | T = 216 hrs | T = 1176 hrs | T = 4560 hrs |
| 0.5 × 1 | Average Resistance (Ω) | 77.1 | 70.6 | 69.9 | 72.6 |
| | % Standard Deviation | 8.3% | 8.3% | 8.5% | 8.4% |
| 1 × 2 | Average Resistance (Ω) | 67.3 | 66.0 | 70.7 | 70.0 |
| | % Standard Deviation | 7.5% | 8.3% | 9.4% | 8.4% |
| 2 × 4 | Average Resistance (Ω) | 63.6 | 66.0 | 65.7 | 67.7 |
| | % Standard Deviation | 6.2% | 10.1% | 9.5% | 9.0% |
| 4 × 8 | Average Resistance (Ω) | 63.3 | 66.2 | 66.6 | 71.6 |
| | % Standard Deviation | 10.9% | 9.1% | 6.8% | 20.6% |

TABLE 4

| Contact Size (mm) | | Dianal MB 2752 + 37.5% Desomodur BL 3575 | | | |
|---|---|---|---|---|---|
| | | T = 0 | T = 216 hrs | T = 1176 hrs | T = 4560 hrs |
| 0.5 × 1 | Average Resistance (Ω) | 82.8 | 69.0 | 65.9 | 70.9 |
| | % Standard Deviation | 11.7% | 7.8% | 10.3% | 10.5% |
| 1 × 2 | Average Resistance (Ω) | 74.4 | 69.2 | 65.1 | 68.0 |
| | % Standard Deviation | 10.2% | 7.4% | 6.2% | 8.7% |
| 2 × 4 | Average Resistance (Ω) | 69.0 | 65.9 | 63.0 | 65.8 |
| | % Standard Deviation | 8.4% | 5.9% | 8.0% | 6.3% |
| 4 × 8 | Average Resistance (Ω) | 68.2 | 65.6 | 66.6 | 67.2 |
| | % Standard Deviation | 8.1% | 9.0% | 5.4% | 7.2% |

Example 12

Reflowable Thick Overcoat with Good Contact Resistance and Improve Scratch Resistance Using Powder Coating Resin A transparent conductive layer with a thermoplastic overcoat was prepared as follows. An ink was prepared containing 0.1 wt % silver nanowires, 0.2% HPMC (Methocel K100), and 250 ppm surfactant (Triton X100). The ink was coated onto two, 3"×3" single side hardcoat PET substrate (substrates were taped to 4"×4" soda lime glass for spin coating using polyimide tape, ink coating was on the non-hard coated side) by spin coating at 750 rpm for 60 seconds. The film was then dried at 50 degrees C. for 90 seconds, and baked at 140 degrees C. for 90 seconds, resulting in a coating with a sheet resistance of approximately 150 ohms/square.

EPON 2002 (powder coating resin based on bisphenol A/epichlorohydrin epoxy resin), available from Momentive Specialty Chemicals Inc., was dissolved in diacetone alcohol (DAA) at a concentration of 15 wt %. EPIKURE P 101 (Imidazole based curing agent for EPON 2002) was dissolved at a concentration of 15 wt % in DAA. The two solutions were mixed together to achieve 5 wt % EPIKURE P 101 in the formulation relative to EPON 2002.

The EPON 2002/EPIKURE P 101 formulation was spin coated at 500 rpm for 60 seconds onto two separate 3"×3" single side hardcoat PET substrate coated with nanowire layers previously (as mentioned in the above paragraph) to produce overcoats of approximately 1.5 μm thickness. The samples were dried at 50 degrees C. for 90 seconds, baked at 100 degrees C. for up to 3 minutes to obtain a non-tacky film.

The samples were cut into a size of 46 mm×56 mm and screen printing was used to print two silver bus bars (3 mm×44 mm) along the smaller edge for resistance measurement. Toyobo DW-117-41T05 silver paste was used for printing the bus bars using Affiliated Manufacturers Inc. (ami) MSP-485 screen printer installed with a rubber squeeze of 70 durometer hardness. A stainless steel screen with 250 mesh size was used for printing. After printing, the samples (including the EPON 2002/EPIKURE P 101 coatings and silver paste) were cured at 130 degree C. for 30 minutes. The total resistance of the film was measure using a multimeter and curing of the film was tested by wiping the coating with a wet lab wipe soaked with acetone.

The total resistance measured for the two samples was 156.8 ohms and 151.6 ohms and no overcoat wiping was observed after wiping with acetone soaked lab wipe. This indicates that the uncured overcoat was stable during the film processing (coating, drying, silver paste printing) and allowed for a very thick overcoat with very low contact resistance which can be further cured during the silver paste curing step to achieve mechanically robust film.

The films prepared in Examples 11 and 12 were subjected to scratch resistance tests. The scratch resistance was measured using Elcometer 3086 motorized Pencil hardness test. The hardness was assessed by following ASTM method: ASTM D3363 according to a hardness scale from soft to hard: 2B, B, HB, F, H, 2H, 3H and 4H. The pencil hardness scale spans from B to 2H. The results are shown in Table 5.

TABLE 5

|  | Overcoat type | Overcoat Thickness (μm) | Pencil Hardness |
|---|---|---|---|
| 125 μm single side hard coat PET coated with Silver nanowires | PMMA | 2 | HB-F |
|  | Dianal MB 2752 + 30% Desmodur BL 3575 | 1.5 | F-H |
|  | Dianal MB 2752 + 37.5% Desmodur BL 3575 | Substrate | H-2H |
|  | EPON 2002 + 5 wt % EPIKURE P 101 | 1.5 | H-2H |

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A layered structure comprising:
   a nanostructure layer having opposite first and second surfaces, the nanostructure layer comprising a plurality of nanostructures, at least two nanostructures of the plurality of nanostructures physically contacting each other; and
   a coating layer having opposite inner and outer surfaces, the inner surface of the coating layer overlying the second surface of the nanostructure layer, the coating layer having a plurality of conductive plugs, at least one conductive plug of the plurality of conductive plugs extending from the inner surface of the coating layer to beyond the outer surface of the coating layer, the at least one conductive plug configured to be placed in electrical communication with the nanostructure layer, wherein the layered structure has a center portion and a perimeter portion, and the plurality of conductive plugs are only distributed along the perimeter portion.

2. The layered structure of claim 1, wherein the coating layer comprises a plurality of contact areas and the plurality of conductive plugs are formed in each contact area of the plurality of contact areas.

3. The layered structure of claim 2, wherein at least one of the contact areas of the plurality of contact areas is greater than 1 mm$^2$.

4. The layered structure of claim 1, wherein the at least one conductive plug is a paste or epoxy comprising at least one of silver, copper, graphite, or carbon.

5. The layered structure of claim 1, wherein the at least one conductive plug comprises one or more nanoparticles.

6. The layered structure of claim 1, wherein the inner surface of the coating layer adheres to the second surface of the nanostructure layer.

7. The layered structure of claim 6, wherein the coating layer comprises a reflowable polymer.

8. The layered structure of claim 7, wherein the reflowable polymer comprises at least one material selected from the group consisting of poly(methyl methacrylate), a dissolved powder coating resin, a copolymer of methyl methacrylate, a hydroxyl functional monomer, a carboxylate functional monomer, an amine monomer, and an epoxy monomer.

9. The layered structure of claim 7, wherein the coating layer comprises at least one material selected from the group consisting of a UV curable resin, a blocked isocyanate, and a melamine based cross-linker.

10. The layered structure of claim 7, wherein the reflowable polymer is a polymer or copolymer comprising acrylate monomers represented by the following formula:

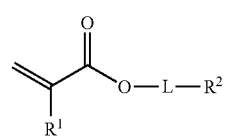

wherein, $R^1$ is hydrogen or alkyl,

L is a direct bond, an alkylene chain, or an alkylene oxide chain, and $R^2$ is hydrogen, hydroxyl, amino (including mono-, di-substituted amino), glycidyl, substituted or unsubstituted alkyl, or substituted or unsubstituted aryl.

11. A display comprising:

a nanostructure layer having opposite first and second surfaces, the nanostructure layer comprising a plurality of nanostructures, at least two nanostructures of the plurality of nanostructures physically contacting each other;

a coating layer having opposite inner and outer surfaces, the inner surface of the coating layer overlying the second surface of the nanostructure layer, the coating layer having a plurality of conductive plugs therein, at least one conductive plug of the plurality of conductive plugs having a first end configured to be placed in electrical communication with the nanostructure layer and a second end extending beyond the outer surface of the coating layer, wherein the display has a center portion and a perimeter portion, and the plurality of conductive plugs are only distributed along the perimeter portion; and a substrate proximate the first surface of the nanostructure layer.

12. The display of claim 11, wherein each of the plurality of conductive plugs comprises one or more nanoparticles.

13. The display of claim 11, wherein the coating layer comprises a plurality of contact areas, and wherein the plurality of conductive plugs are located in each contact area of the plurality of contact areas.

14. The display of claim 11, wherein the inner surface of the coating layer adheres to the second surface of the nanostructure layer.

15. The display of claim 14, wherein the coating layer comprises a reflowable polymer.

16. The display of claim 15, wherein the coating layer comprises at least one material selected from the group consisting of a UV curable resin, a blocked isocyanate, and a melamine based cross-linker.

17. The layered structure of claim 2, wherein the at least one conductive plug is a void filled with a conductive material, the second surface of the nanostructure layer is exposed through the void, and an area of the second surface of the nanostructure layer that is exposed through the void is less than 1% of each of the contact areas.

18. The layered structure of claim 1, wherein the at least one conductive plug is connected to ground.

19. The display of claim 11, wherein the second end is connected to ground.

* * * * *